US009063181B2

(12) United States Patent  
Banker

(10) Patent No.: US 9,063,181 B2  
(45) Date of Patent: Jun. 23, 2015

(54) MEMORY MANAGEMENT FOR AN INTELLIGENT ELECTRONIC DEVICE

(75) Inventor: Patricia E. Banker, Park Ridge, NJ (US)

(73) Assignee: Electro Industries/Gauge Tech, Westbury, NY (US)

( * ) Notice: Subject to any disclaimer, the term of this patent is extended or adjusted under 35 U.S.C. 154(b) by 717 days.

(21) Appl. No.: 11/965,798

(22) Filed: Dec. 28, 2007

(65) Prior Publication Data

US 2008/0195794 A1 Aug. 14, 2008

Related U.S. Application Data

(60) Provisional application No. 60/877,722, filed on Dec. 29, 2006.

(51) Int. Cl.
*G06F 12/02* (2006.01)
*G01R 21/133* (2006.01)
*G01R 19/25* (2006.01)

(52) U.S. Cl.
CPC ...... *G01R 21/133* (2013.01); *G06F 2212/7207* (2013.01); *G01R 19/2513* (2013.01); *G06F 12/0246* (2013.01); *G06F 2212/1036* (2013.01); *G06F 2212/7211* (2013.01)

(58) Field of Classification Search
CPC ....... G06F 12/00–12/16; G06F 12/12–12/128; G06F 2212/69; G06F 2212/72–2212/7211; G06F 3/0679; G06F 12/0246; G06F 17/30218; G06F 2212/2022
USPC .......... 707/999.2, 999.205, 999.206; 711/133–135, 154, 156, 159–160, 103
See application file for complete search history.

(56) References Cited

U.S. PATENT DOCUMENTS

| | | | |
|---|---|---|---|
| 5,459,850 A * | 10/1995 | Clay et al. | 711/171 |
| 5,475,693 A * | 12/1995 | Christopherson et al. | 714/710 |
| 5,485,595 A * | 1/1996 | Assar et al. | 711/103 |
| 5,598,370 A * | 1/1997 | Niijima et al. | 365/185.33 |
| 5,634,050 A * | 5/1997 | Krueger et al. | 1/1 |
| 5,640,529 A * | 6/1997 | Hasbun | 711/103 |
| 5,650,936 A | 7/1997 | Loucks et al. | |
| 5,736,847 A | 4/1998 | Van Doorn et al. | |
| 5,787,445 A * | 7/1998 | Daberko | 1/1 |
| 5,828,576 A | 10/1998 | Loucks et al. | |

(Continued)

OTHER PUBLICATIONS

Xu Hong, Wang Jianhua, "An Extendable Data Engine based on OPC Spcification"; Computer Standards & Interfaecs 26 (2004) 515-525; Dec. 5, 2003.

*Primary Examiner* — Aimee Li
*Assistant Examiner* — Nicholas Simonetti
(74) *Attorney, Agent, or Firm* — Gerald E. Hespos; Michael J. Porco; Matthew T. Hespos

(57) ABSTRACT

A device and method are provided for managing flash memory of an intelligent electronic device (IED) to maximize the IED life. The IED includes at least one sensor for sensing at least one electrical parameter distributed to a load. At least one analog-to-digital converter is coupled to the at least one sensor for converting an analog signal output from the at least one sensor to digital data. A processing unit is coupled to the at least one analog-to-digital converter to receive the digital data and store the digital data in a memory. The memory includes sectors configured to store the digital data. The processing unit stores the digital data in each of the sectors and equalizes usage of each sector over time by equalizing a number of erases for each of the sectors over time.

28 Claims, 22 Drawing Sheets

(56) References Cited

U.S. PATENT DOCUMENTS

| | | |
|---|---|---|
| 5,995,911 A | 11/1999 | Hart |
| 6,000,034 A | 12/1999 | Lightbody et al. |
| D427,533 S | 7/2000 | Cowan et al. |
| D429,655 S | 8/2000 | Cowan et al. |
| D435,471 S | 12/2000 | Simbeck et al. |
| 6,185,508 B1 | 2/2001 | Van Doorn et al. |
| 6,186,842 B1 | 2/2001 | Hirschbold et al. |
| D439,535 S | 3/2001 | Cowan et al. |
| 6,236,949 B1 | 5/2001 | Hart |
| D443,541 S | 6/2001 | Hancock et al. |
| 6,256,762 B1* | 7/2001 | Beppu ................... 714/763 |
| 6,397,155 B1 | 5/2002 | Przydatek et al. |
| D458,863 S | 6/2002 | Harding et al. |
| D459,259 S | 6/2002 | Harding et al. |
| 6,493,644 B1 | 12/2002 | Jonker et al. |
| 6,563,697 B1 | 5/2003 | Simbeck et al. |
| 6,611,773 B2 | 8/2003 | Przydatek et al. |
| 6,611,922 B2 | 8/2003 | Ozcetin et al. |
| 6,615,147 B1 | 9/2003 | Jonker et al. |
| 6,636,030 B1 | 10/2003 | Rose et al. |
| 6,671,635 B1 | 12/2003 | Forth et al. |
| 6,671,654 B1 | 12/2003 | Forth et al. |
| 6,687,627 B1 | 2/2004 | Gunn et al. |
| 6,694,270 B2 | 2/2004 | Hart |
| 6,735,535 B1 | 5/2004 | Kagan et al. |
| 6,737,855 B2 | 5/2004 | Huber et al. |
| 6,745,138 B2 | 6/2004 | Przydatek et al. |
| 6,751,562 B1 | 6/2004 | Blackett et al. |
| 6,751,563 B2 | 6/2004 | Spanier et al. |
| 6,792,337 B2 | 9/2004 | Blackett et al. |
| 6,792,364 B2 | 9/2004 | Jonker et al. |
| 6,798,190 B2 | 9/2004 | Harding et al. |
| 6,798,191 B1 | 9/2004 | Macfarlane et al. |
| 6,813,571 B2 | 11/2004 | Lightbody et al. |
| 6,825,776 B2 | 11/2004 | Lightbody et al. |
| 6,853,978 B2 | 2/2005 | Forth et al. |
| 6,871,150 B2 | 3/2005 | Huber et al. |
| D505,087 S | 5/2005 | Ricci et al. |
| 6,944,555 B2 | 9/2005 | Blackett et al. |
| 6,957,158 B1 | 10/2005 | Hancock et al. |
| 6,961,641 B1 | 11/2005 | Forth et al. |
| 6,983,211 B2 | 1/2006 | Macfarlene et al. |
| 6,988,025 B2 | 1/2006 | Ransom et al. |
| 6,988,182 B2 | 1/2006 | Teachman et al. |
| 6,990,395 B2 | 1/2006 | Ransom et al. |
| 7,006,934 B2 | 2/2006 | Jonker et al. |
| 7,010,438 B2 | 3/2006 | Hancock et al. |
| 7,072,779 B2 | 7/2006 | Hancock et al. |
| 7,085,824 B2 | 8/2006 | Forth et al. |
| 7,089,089 B2 | 8/2006 | Cumming et al. |
| 7,096,316 B1* | 8/2006 | Karr et al. ................... 711/114 |
| 7,127,328 B2 | 10/2006 | Ransom |
| D532,747 S | 11/2006 | Ricci et al. |
| 7,136,384 B1 | 11/2006 | Wang |
| D534,120 S | 12/2006 | Ricci et al. |
| 7,155,350 B2 | 12/2006 | Kagan |
| 7,158,050 B2 | 1/2007 | Lightbody et al. |
| 7,174,258 B2 | 2/2007 | Hart |
| 7,174,261 B2 | 2/2007 | Gunn et al. |
| 7,184,904 B2 | 2/2007 | Kagan |
| 7,188,003 B2 | 3/2007 | Ransom et al. |
| 7,191,076 B2 | 3/2007 | Huber et al. |
| 7,216,043 B2 | 5/2007 | Ransom et al. |
| 7,246,014 B2 | 7/2007 | Forth et al. |
| 7,248,977 B2 | 7/2007 | Hart |
| 7,248,978 B2 | 7/2007 | Ransom |
| 7,249,265 B2 | 7/2007 | von Carolsfeld et al. |
| 7,256,709 B2 | 8/2007 | Kagan |
| 7,271,996 B2 | 9/2007 | Kagan et al. |
| 7,294,997 B2 | 11/2007 | Kagan |
| 7,304,586 B2 | 12/2007 | Wang et al. |
| 7,305,310 B2 | 12/2007 | Slota et al. |
| 7,337,081 B1 | 2/2008 | Kagan |
| 7,472,138 B2* | 12/2008 | Adkins et al. ................... 1/1 |
| 2002/0051466 A1* | 5/2002 | Bruckman ................... 370/474 |
| 2002/0114326 A1 | 8/2002 | Mahalingaiah |
| 2002/0162014 A1* | 10/2002 | Przydatek et al. ............ 713/200 |
| 2002/0165677 A1 | 11/2002 | Lightbody et al. |
| 2002/0166022 A1* | 11/2002 | Suzuki ................... 711/103 |
| 2002/0188814 A1* | 12/2002 | Saito et al. ................... 711/159 |
| 2003/0003908 A1* | 1/2003 | McGrew et al. ............... 455/426 |
| 2003/0014200 A1 | 1/2003 | Jonker et al. |
| 2003/0065459 A1 | 4/2003 | Huber et al. |
| 2003/0101008 A1 | 5/2003 | Hart |
| 2003/0105608 A1 | 6/2003 | Hart |
| 2003/0132742 A1 | 7/2003 | Harding et al. |
| 2003/0154471 A1 | 8/2003 | Teachman et al. |
| 2003/0210699 A1 | 11/2003 | Holt, Sr. et al. |
| 2003/0212512 A1 | 11/2003 | Hart |
| 2003/0220752 A1 | 11/2003 | Hart |
| 2004/0028041 A1* | 2/2004 | Yasue ................... 370/389 |
| 2004/0066311 A1 | 4/2004 | Giles et al. |
| 2004/0138786 A1 | 7/2004 | Blackett et al. |
| 2004/0138787 A1 | 7/2004 | Ransom et al. |
| 2004/0138835 A1 | 7/2004 | Ransom et al. |
| 2004/0172207 A1 | 9/2004 | Hancock et al. |
| 2004/0183522 A1 | 9/2004 | Gunn et al. |
| 2004/0229578 A1 | 11/2004 | Lightbody et al. |
| 2005/0017874 A1 | 1/2005 | Lightbody et al. |
| 2005/0027464 A1 | 2/2005 | Jonker et al. |
| 2005/0071106 A1 | 3/2005 | Huber et al. |
| 2005/0275397 A1 | 12/2005 | Lightbody et al. |
| 2005/0281105 A1* | 12/2005 | Oshima ................... 365/200 |
| 2005/0288876 A1 | 12/2005 | Doig et al. |
| 2005/0288877 A1 | 12/2005 | Doig et al. |
| 2006/0039196 A1* | 2/2006 | Gorobets et al. ......... 365/185.01 |
| 2006/0052958 A1 | 3/2006 | Hancock et al. |
| 2006/0071813 A1 | 4/2006 | Kagan |
| 2006/0077999 A1 | 4/2006 | Kagan et al. |
| 2006/0086893 A1 | 4/2006 | Spanier et al. |
| 2006/0106972 A1* | 5/2006 | Gorobets et al. ............... 711/103 |
| 2006/0161400 A1 | 7/2006 | Kagan |
| 2006/0170409 A1 | 8/2006 | Kagan et al. |
| 2006/0230394 A1 | 10/2006 | Forth et al. |
| 2006/0271244 A1 | 11/2006 | Cumming et al. |
| 2007/0067119 A1 | 3/2007 | Loewen et al. |
| 2007/0067121 A1 | 3/2007 | Przydatek et al. |
| 2007/0136010 A1 | 6/2007 | Gunn et al. |
| 2007/0150214 A1* | 6/2007 | Qin et al. ................... 702/60 |
| 2008/0046205 A1 | 2/2008 | Gilbert et al. |
| 2008/0065335 A1 | 3/2008 | Doig et al. |

* cited by examiner

MEMORY MANAGEMENT FOR AN INTELLIGENT ELECTRONIC DEVICE

This application claims priority on U.S. Provisional Patent Appl. No. 60/877,722, filed Dec. 29, 2006, the contents of which are hereby incorporated by reference in its entirety.

BACKGROUND OF THE INVENTION

1. Field of the Invention

The present disclosure relates generally to intelligent electronic devices for electrical power systems, and more particularly, to a method for managing flash memory of an intelligent electronic device to maximize the device life.

2. Description of the Related Art

Electric utility companies ("utilities") track electric usage by customers by using power meters. These meters track the amount of power consumed at a particular location. These locations range from power substations, to commercial businesses, to residential homes. The electric utility companies use information obtained from the power meter to charge their customers for their power consumption, i.e. revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., at a substation. These power and energy meters are installed in substations to provide a visual display of real-time data and to alarm when problems occur. These problems include limit alarms, breaker control, outages and many other types of events.

Conventionally, these meters include memory to store data such as measured parameters, results of power quality analysis, etc. This data may be stored over time for retrieval at a later time, e.g., via a SCADA (supervisory control and data acquisition) system which may be in a different location from the meter. Depending on the amount of data stored on the device and how often this data is retrieved, these meters may require a large amount of memory for data storage. The information may be organized into multiple files or logs, of varying sizes, and each managed independently of the others.

Therefore, a need exists for devices, systems and methods for storing data sensed and generated by an intelligent electronic device (IED) and for managing the stored data to extend the useful life of the meter.

SUMMARY OF THE INVENTION

An intelligent electronic device (IED), e.g., an electrical power meter, having at least one flash memory device for storing data sensed and generated by the intelligent electronic device is provided. Due to the large memory requirements of the IED, the flash memory is provided for non-volatile information storage. However, flash devices wear out after a large but finite number of erases. Therefore, a memory management method is provided for maximizing the life of the flash memory device.

According to one aspect of the present disclosure, an intelligent electronic device includes at least one sensor configured for sensing at least one electrical parameter distributed to a load; at least one analog-to-digital converter coupled to the at least one sensor and configured for converting an analog signal output from the at least one sensor to a digital data; a processing unit coupled to the at least one analog-to-digital converter configured to receive the digital data and store the digital data in a memory, and the memory including a plurality of sectors configured to store the digital data, wherein the processing unit stores the digital data in each of the plurality of sectors to equalize usage of each sector over time. The memory may be a flash memory or removable memory.

The memory of the IED has no separate directory of its contents but instead is organized in such a way that a directory can be reconstructed at any time from data in individual sectors. Each sector of the memory includes a header configured to store an erase count of the sector. The sector header is further configured to store a sequence number correlating the sector to at least one log. The sector header is further configured to store an assignment of the sector, wherein the assignment is erased, available, in use and for which log, or released, and in which lack of one of the above assignments is equivalent to an assignment of dead.

In a further aspect, upon startup of the device, the processing unit is further configured to construct a sector directory for each sector for determining the contents of each sector and a log directory for determining the sectors associated with each of the at least one log.

According to a further aspect of the present disclosure, a method for managing memory in an intelligent electronic device, the memory including a plurality of sectors, the method including the steps generating data to be stored in the memory; reading an erase count of each of the plurality of sectors; determining the sector having the lowest erases count; and storing the data in the determined sector having the lowest erase count. The data is assigned to at least one log, the log being configured to store a plurality of related data, the method further comprising determining which sectors are assigned to the at least one log. Each sector includes a header configured to store an erase count of the sector. The sector header is further configured to store a sequence number correlating the sector to the at least one log and to store a log assignment of the sector. In one aspect, the assignment is erased, available, log number (in use), released or dead.

In another aspect, the method further includes determining the sector assignment and sequence number for each of the plurality of sectors and generating a sector directory, wherein the sector directory is not stored in the same memory as the data.

BRIEF DESCRIPTION OF THE DRAWINGS

The above and other aspects, features, and advantages of the present disclosure will become more apparent in light of the following detailed description when taken in conjunction with the accompanying drawings in which:

FIGS. 12-21 illustrate a method for managing memory according to another embodiment of the present disclosure in which:

FIG. 12 is a flow chart illustrating a method for initializing a flash memory device of an intelligent electronic device in accordance with the present disclosure;

FIG. 13 is a flow chart illustrating a method for determining sector assignments of a flash memory device in accordance with the present disclosure;

FIG. 14 is a flow chart illustrating a method for computing sizes of all files, e.g., logs, stored in a flash memory device in accordance with the present disclosure;

FIG. 15 is a flow chart illustrating a method for building a sector list of a flash memory device in accordance with the present disclosure;

FIGS. 16 and 17 illustrate a flow chart of a method for loading log information in a flash memory device in accordance with the present disclosure;

FIG. 18 is a flow chart illustrating a method for resetting a log of a flash memory device in accordance with the present disclosure;

FIG. 19 is a flow chart illustrating a method for appending a record to a log of a flash memory device in accordance with the present disclosure;

FIG. 20 is a flow chart illustrating a method for emptying a sector of a flash memory device in accordance with the present disclosure;

FIG. 21 is a flow chart illustrating a method for assigning an empty sector to a log.

DETAILED DESCRIPTION OF THE PREFERRED EMBODIMENTS

Preferred embodiments of the present disclosure will be described hereinbelow with reference to the accompanying drawings. In the following description, well-known functions or constructions are not described in detail to avoid obscuring the present disclosure in unnecessary detail.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering.

Figure 1:
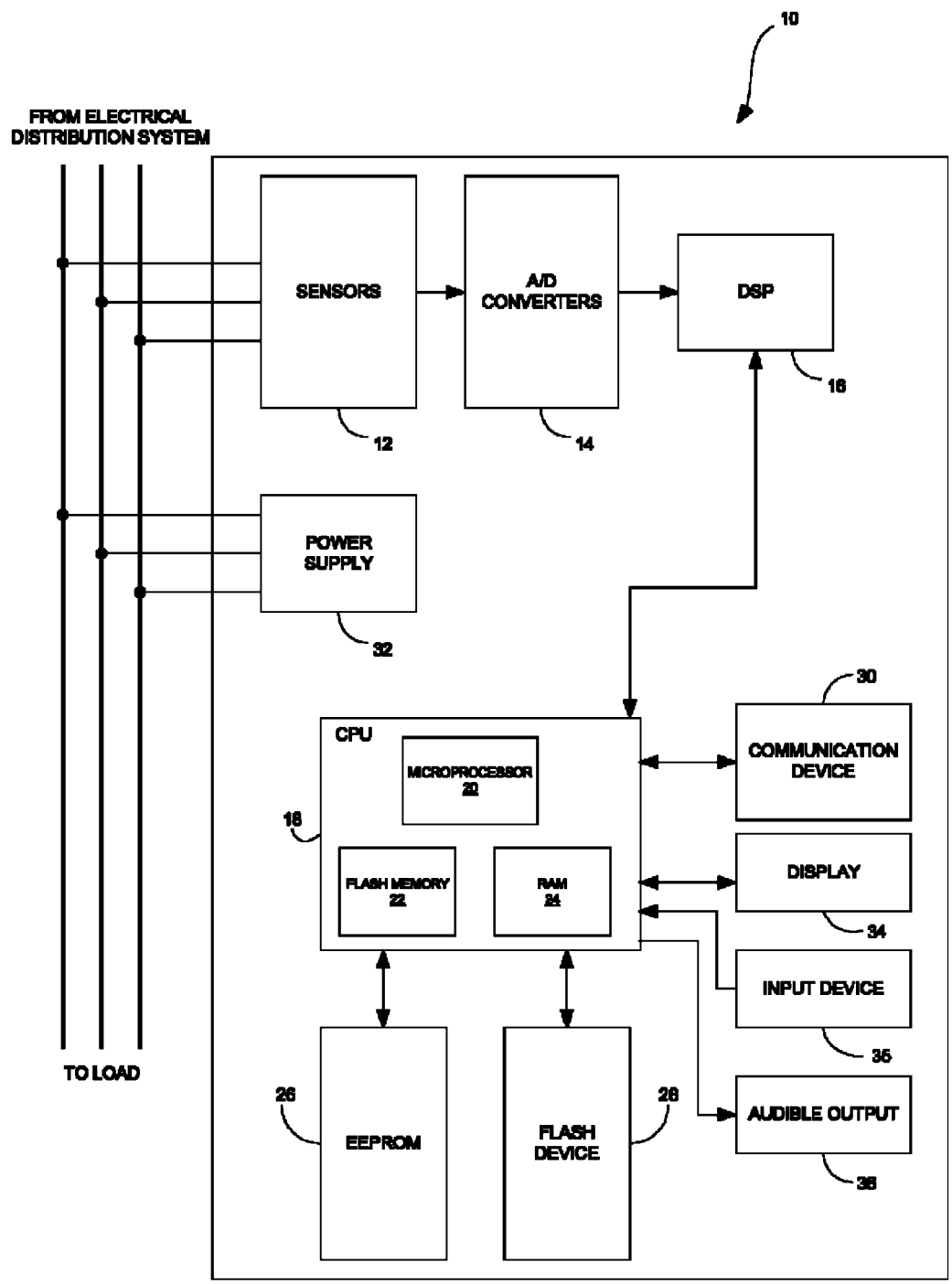
FIG. 1 is a diagram of an intelligent electronic device in accordance with an embodiment of the present disclosure.

An intelligent electronic device (IED) 10 for monitoring and determining an amount of electrical power usage by a consumer and for providing audible and visual indications to a user is illustrated in FIG. 1. Generally, the IED 10 includes sensors 12, a plurality of analog-to-digital (A/D) converters 14 and a processing system including a central processing unit (CPU) 18 and/or a digital signal processor (DSP) 16. The sensors 12 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 18 or DSP 16.

The CPU 18 is configured for receiving the digital signals from the A/D converters 14 to perform the necessary calculations to determine the power usage and controlling the overall operations of the IED 10. In a preferred embodiment, the DSP 16 will receive the digital signals from the A/D converters 14 and perform the necessary calculations to determine the power usage to free the resources of the CPU 18. The CPU 18 will include a microprocessor 20 executing instructions and performing various calculations, and flash memory 22 for storing executable instructions and permanent data tables for controlling the overall operation of the microprocessor and random access memory (RAM) 24 for holding data during computations by the microprocessor 20.

A first memory 26 is coupled to CPU 18 and stores calibration and setup parameters of the IED 10, e.g., meter configuration, serial number of the device, etc. Memory 26 may be an integrated circuit in the form of a FLASH or EEPROM, or any other known or to be developed type of memory which is nonvolatile, capable of being changed in the IED, and amenable to making such changes difficult for an end user.

The IED 10 further includes a second memory 28 for storing sensed and generated data for further processing and for retrieval, e.g., data logs. Memory 28 is flash memory and may be removable or non-removable. In one embodiment, data stored on memory 28 may be retrieved by an external device or computer via a communication device 30. In another embodiment, where memory 28 is removable, memory 28 will be in the form of a memory card such as a CompactFlash card, a Memory Stick, a SmartMedia card, etc., and data stored therein will be retrieved from an appropriate memory card reader.

A power supply 32 is also provided for providing power to each component of the IED 10. In one embodiment, the power supply 32 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 32, e.g., from a different electrical circuit, an uninterruptible power supply (UPS), etc.

The IED 10 of the present disclosure will have a user interface for interacting with a user and for communicating events, alarms and instructions to the user. The user interface will include a display 34 for providing visual indications to the user. The display 34 may include a touch screen, a liquid crystal display (LCD), a plurality of LED number segments, individual light bulbs or any combination of these. The display 34 may provide the information to the user in the form of alpha-numeric lines, computer-generated graphics, videos, etc. The user interface will include an input device 35 for entering data, e.g., parameters, limits, etc. The input device may include pushbuttons, a keypad, a touch screen, at least one dial, etc. The user interface may also include a speaker or audible output means 36 for audibly producing instructions, alarms, data, etc. The speaker 36 will be coupled to the CPU 18 via a digital-to-analog converter (D/A) for converting digital audio files stored in memory to analog signals playable by the speaker 36.

The IED 10 will include the communication device 30 for enabling data communications between the IED 10 and other computing devices, e.g., a desktop computer, laptop computer, other IEDs, etc. The communication device 34 may be a modem, network interface card (NIC), wireless transceiver, etc. As described above, the IED 10 may be coupled to a personal computer over a network, e.g., a LAN, WAN, the Internet, etc., via the communication device 30, where the personal computer will retrieve data, e.g., logs, from the IED 10. The communication device 30 will perform its functionality by hardwired and/or wireless connectivity. The hardwire connection may include but is not limited to hard wire cabling e.g., parallel or serial cables, USB cable, Firewire (1394 connectivity) cables, and the appropriate port. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols or systems currently existing or to be developed for wirelessly transmitting data. It is to be appreciated that the network may be a local area network (LAN), wide area network (WAN), the Internet or any known network that couples a plurality of computers to enable various modes of communication via network messages. Furthermore, the IED 10 will communicate using the various known protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc.

It is to be understood that the present disclosure may be implemented in various forms of hardware, software, firmware, special purpose processors, or a combination thereof. The IED may also include an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

As the IED 10 collects data and processes the collected data, the data will be stored on flash memory 28. The data may be stored in various types of logs, e.g., a historical trend log which is a collection of time-stamped records used to track any parameter over time. Other exemplary logs may include limit logs, event-triggered waveforms logs (records a waveform when a user-programmable value goes out of limit and when the value returns to normal), power quality logs (records magnitude and duration of voltage and current surges and sags for every power quality event), status change (input) logs, control output (relay) logs, system event logs, flicker logs and reset logs. However, flash devices "wear out" after a large but finite number of erases. This can become an issue if the same place in the flash memory is used over and over again.

Flash devices are partitioned into sectors and impose the rule that all bytes in a sector must be erased at the same time. Thus, for managing the number of erases, the sector is the basic unit. The IED 10 of the present disclosure manages sector wear by placing data in the flash memory 28 so that the number of erases in all sectors is equalized over time. The IED 10 uses the flash memory for its logs. This technique is appropriate for any similar application in which memory contents change over time and in which there is slightly more capacity in the flash chip than is actually needed. The extra capacity is used to ensure that free sectors are always available when needed.

Figure 2:
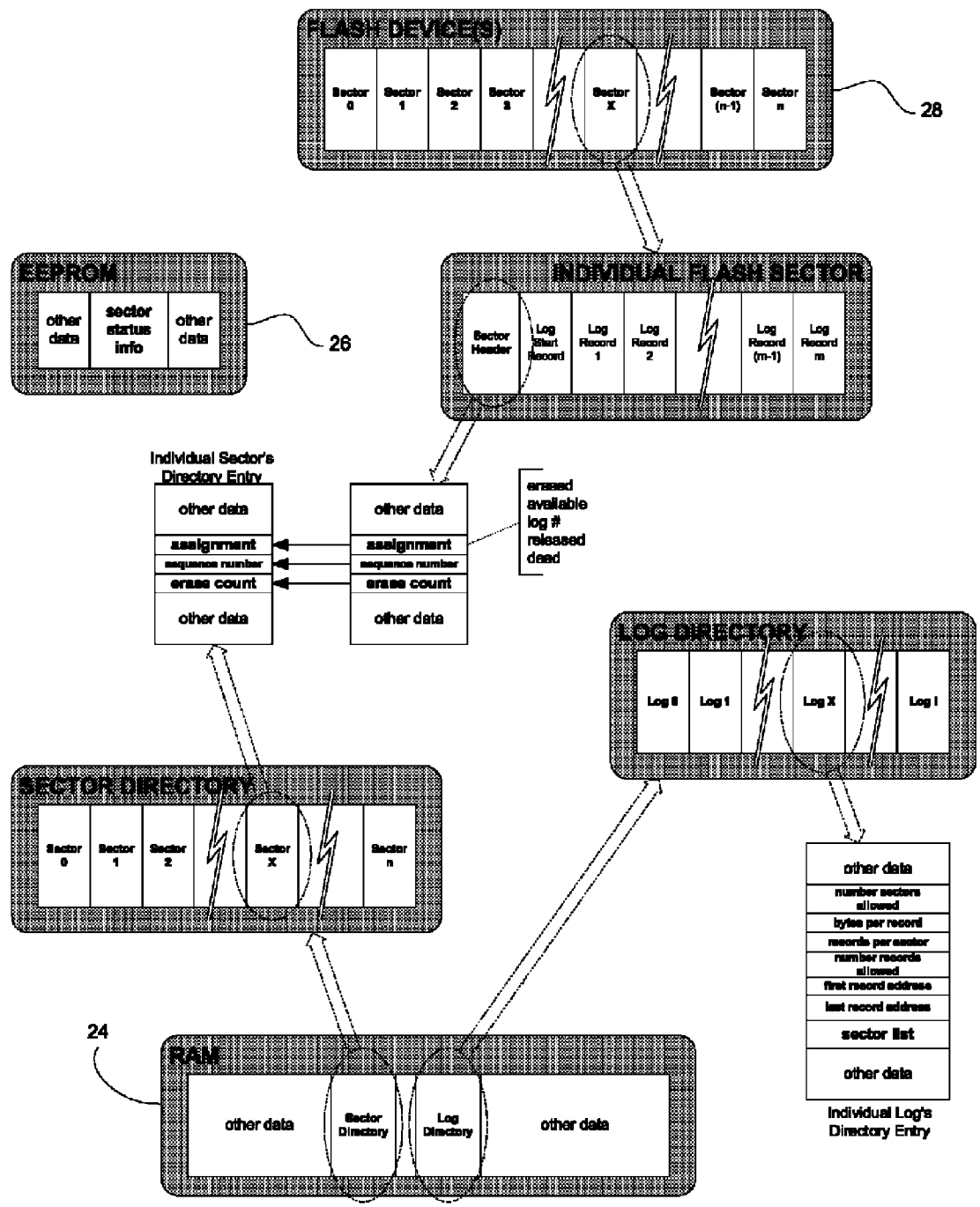
FIG. 2 is a diagram of a memory layout and overall flow diagram of a memory management method of the present disclosure.

A method for prolonging the life of a flash device in accordance with an embodiment of the present disclosure will be described in relation to FIGS. 2-11, where FIG. 2 is a diagram of a memory layout and overall flow diagram of the memory management method and FIGS. 3-11 are flow charts illustrating several processes executing the memory management scheme.

Figure 3:
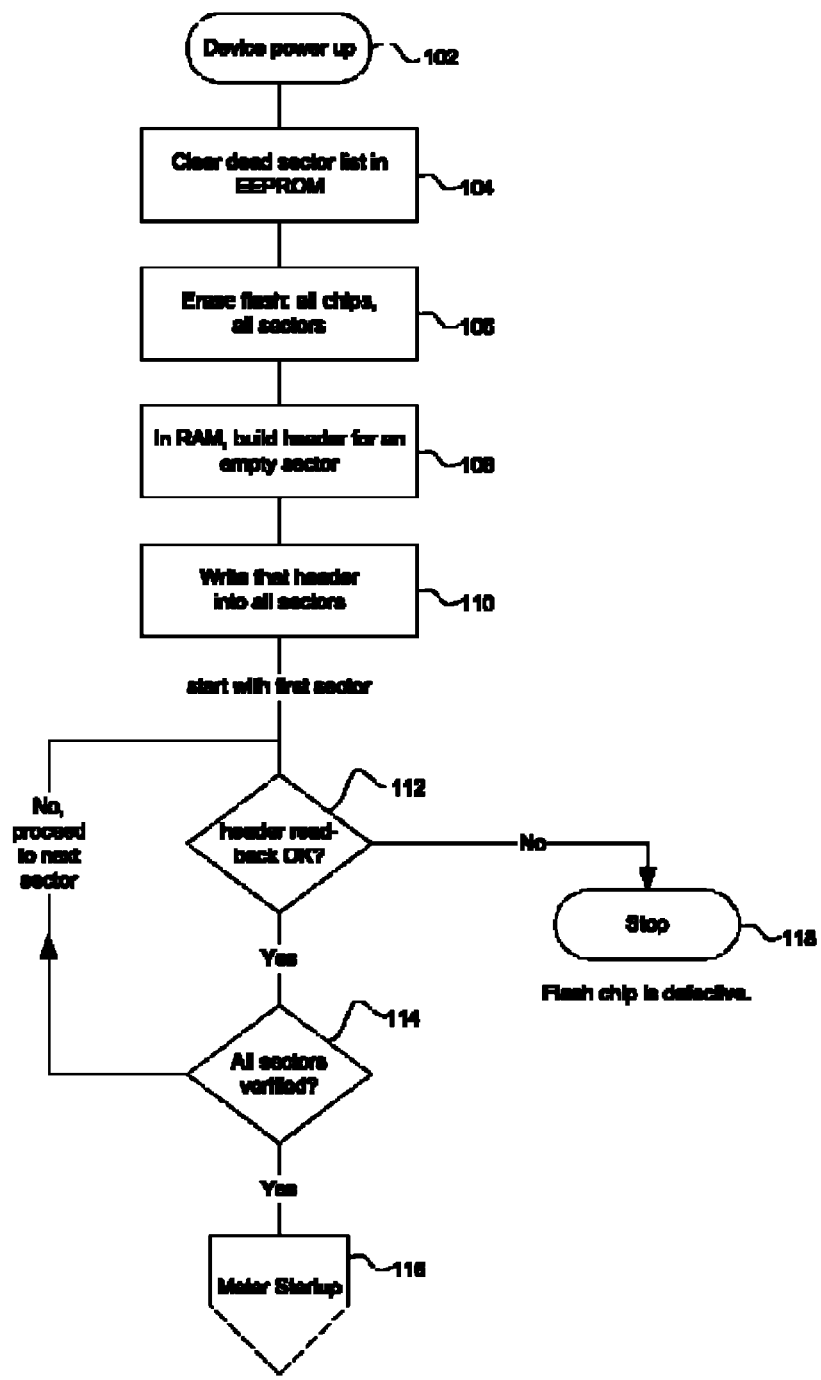
FIG. 3 is a flow chart illustrating a method for initializing a flash memory device of an intelligent electronic device in accordance with the present disclosure.

Referring to FIG. 3, the initial flash device setup is illustrated. Preferably, this process is executed once at the factory during manufacture of the IED 10.

I. Device Setup—FIG. 3

A. Erase Whole Chip

When the flash device 28 is first powered up in its target hardware (step 102), its contents are unknown. Performing an erase of all sectors imposes a known state on every bit in the chip by setting them all to 1's. Therefore, after power-up, a dead sector list is created and cleared in the EEPROM 26 (step 104) and the flash device 28 is erased (step 106), i.e., all chips on device 28 and all sectors on any chip of the flash device 28.

B. Write Sector Headers

It is mandatory that the flash device holds all information needed to construct a sector directory of what data is in each sector and which sectors are empty at power up. Initially, in step 108, RAM 24 will build a header for an empty sector and will write this header into all sectors (step 110). To address this information requirement, a small number of bytes in each sector is designated to keep track of selected characteristics. In the IED 10 of the present disclosure, the first 20 are used, but the exact number and location are not critical. These bytes form the sector header which must contain at least these 4 elements: erase count, assignment bytes, sequence number, and checksums, which will be described below:

1. Erase Count

This is a count of how many times the sector has been erased. In one embodiment, the erase count is 4 bytes, sufficient to hold a count of many more erases that the device is guaranteed to handle. The initial erase count in each sector is 1, reflecting the erase whole chip step above.

2. Assignment Bytes

These bytes indicate what, if any, data the sector holds. They must be able to indicate all possible stages in the sector's life cycle. In one embodiment, the IED 10 uses 2 bytes for this. Both erased means the sector is available, one erased and one written means there is data in the sector, and both written means the sector has been released. In the one erased and one written case, the value written indicates which log this sector belongs to.

3. Sequence Number

This is a number written into each sector as it is assigned to a log. After each use, the number is increased. Thus for any 2 sectors assigned to the same log, the one with the lower sequence number is known to be the older sector. This is used to determine the order of sectors in a multiple-sector log.

4. Checksums

Since the header holds critical information, it is wise to be able to confirm that the contents are valid. The IED 10 uses CRCs (cyclical redundancy check) for this but other methods could be used. Checksums present an interesting problem in flash devices because they can't be updated when sector bytes are changed. The solution in the IED 10 of the present disclosure is to keep 2 checksums: the first is valid when the sector holds data, the second is valid when the sector is released.

After the sector header is written into each sector, each sector will be verified for operation. Staring with the first sector, the CPU 18 will attempt to read back the sector header (step 112). If the sector header reads back OK, the CPU 18 will determine if all sectors have been verified (step 114), and if not, will proceed to the next sector. If all sectors have been verified at step 114, the IED, e.g., meter, will proceed to startup mode and be operational (step 116). However, if in step 112, the sector headers do not read back properly, the flash device 28 will be deemed defective (step 118).

II. Normal Operations—FIGS. 4-11

A. Life Cycle of a Sector

Each sector in the flash device 28 will follow a cycle of states: erased, available, in use, released, or dead. Except for dead, the cycle will repeat many times (erased→available→in use→released→erased, etc.) as data is saved and removed from the device.

1. Erased

This is a transient state that lasts from sector erase until the sector header is written. In flash device 28, it is defined as a sector header with 1's in all bits of all bytes.

2. Available

An available sector is a sector that holds no data but is available to do so. This is the state set up by writing the sector header described above. There are several ways this could be defined in the sector header. In the IED 10 of the present disclosure, it is the combination of an erase count that is not all 1's and all other bytes of the header that are all 1's.

3. In Use

In this state, the sector is holding data or has been prepared to hold data. An assignment byte is written both to indicate that the sector is no longer available and to indicate what data is in the sector. The first assignment byte is set to the log number and the second remains erased. The sequence number is also written at this time.

4. Released

A released sector holds data that is no longer of interest. It can be erased at any time. Conceptually, this state could be skipped, going right to the erase. However, erases take significantly longer than data operations, so it is useful to be able to delay them until the system is less busy.

5. Dead

A dead sector has exhibited an error, i.e., data read back didn't agree with what was written.

B. Construct Directories in RAM of Flash Contents

Once the flash device 28 is initially setup at the factory, the CPU 18 will construct the sector and log directories in RAM 24 of the flash device 28 contents as illustrated in FIGS. 4-8 every time the IED starts up.

Figure 4:
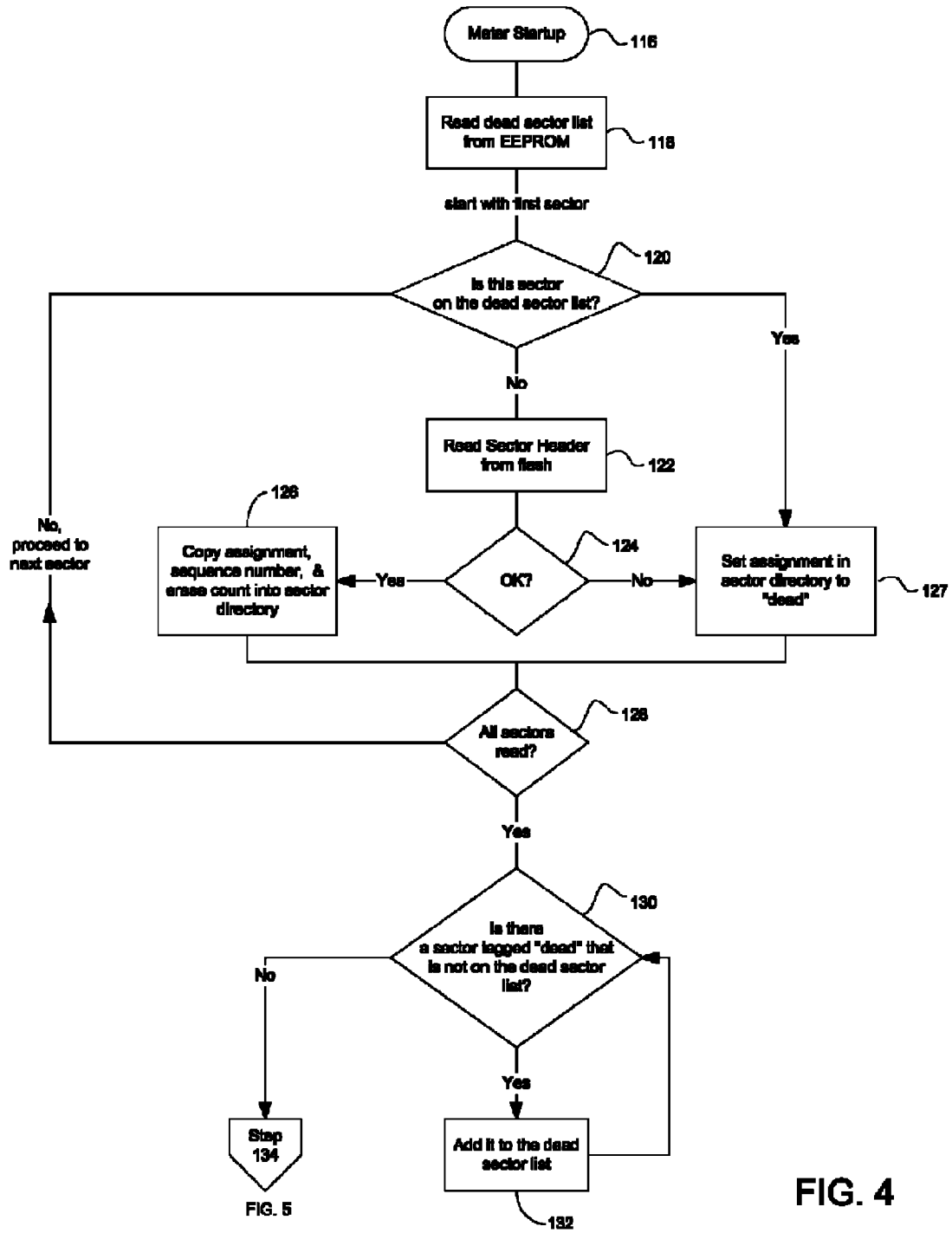
FIG. 4 is a flow chart illustrating a method for determining sector assignments of a flash memory device in accordance with the present disclosure.
Figure 5:
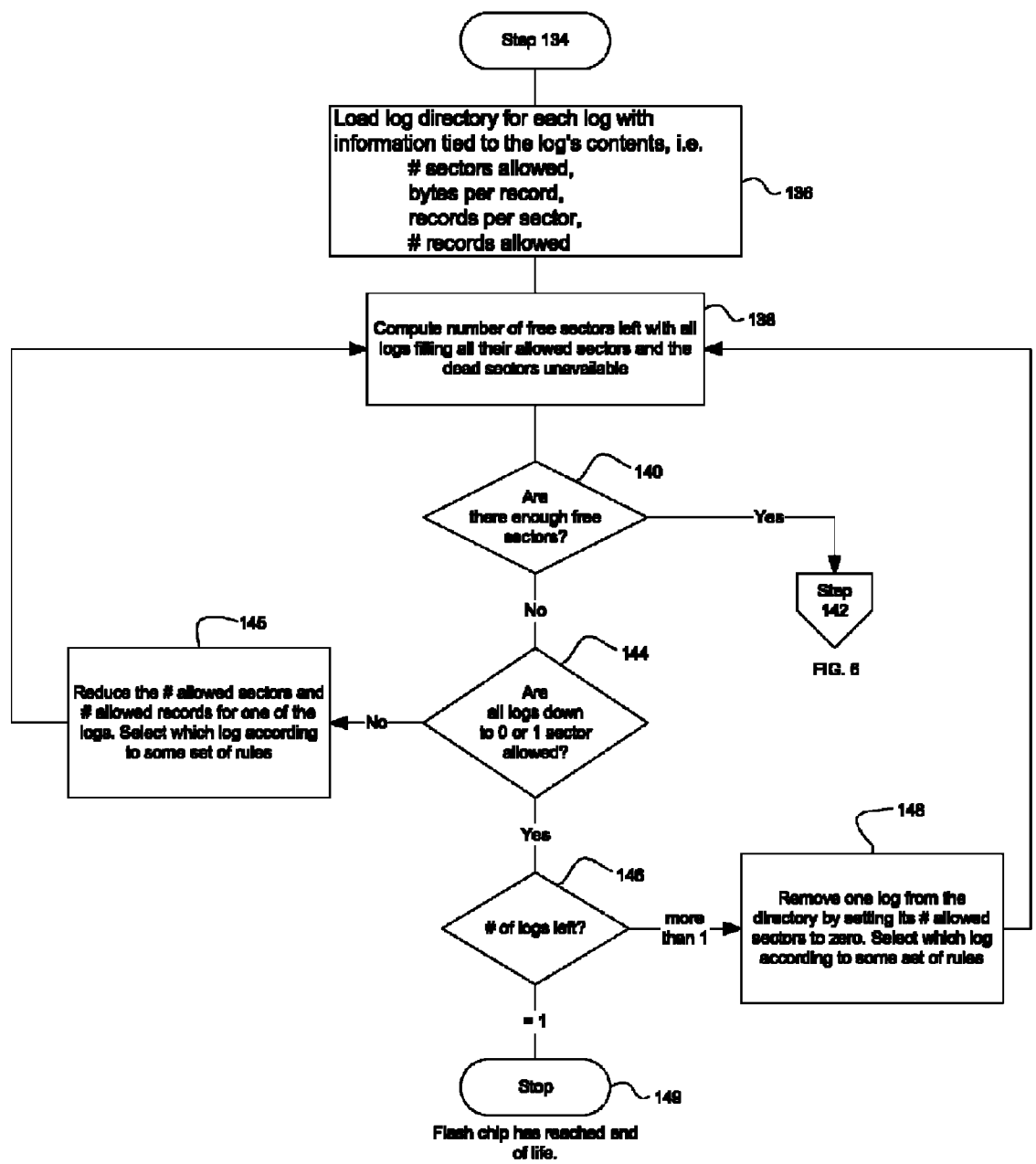
FIG. 5 is a flow chart illustrating a method for computing sizes of all files, e.g., logs, stored in a flash memory device in accordance with the present disclosure.
Figure 6:
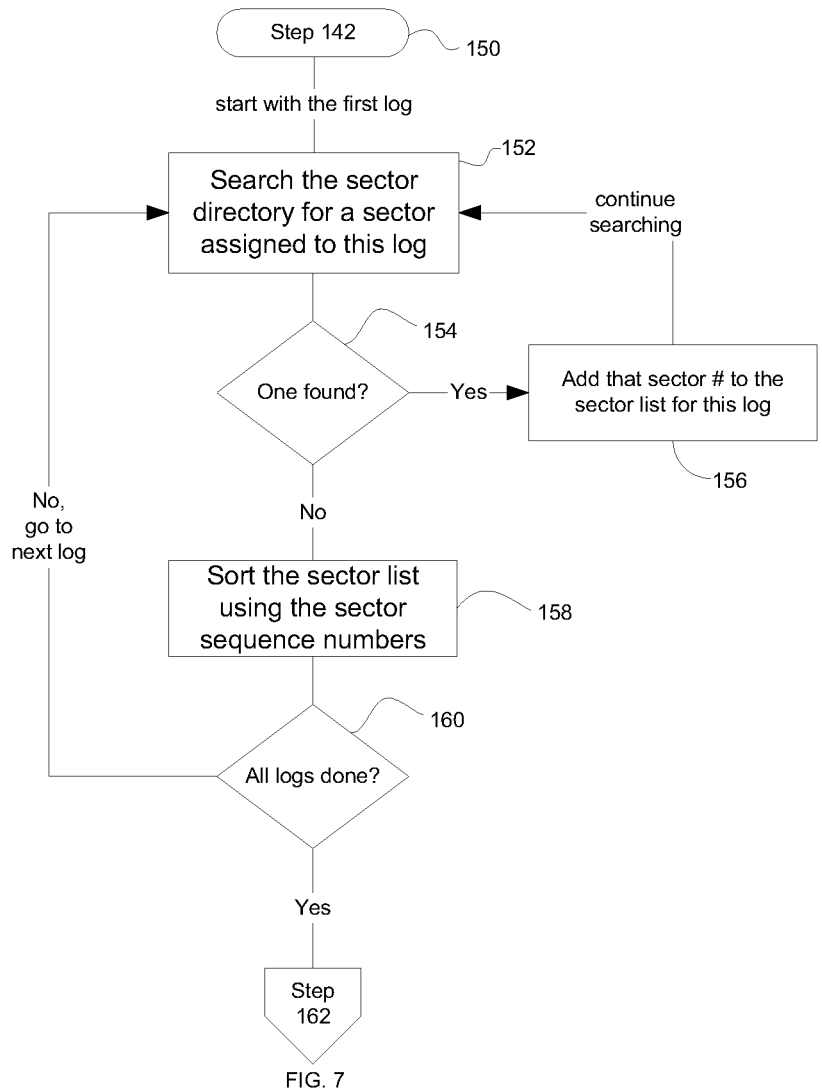
FIG. 6 is a flow chart illustrating a method for building a sector list of a flash memory device in accordance with the present disclosure.

In FIG. 4, the CPU 18 will determine sector assignments and generate the sector directory, in this way, the IED 10 will know what data every sector is holding; in FIG. 5, the CPU 18 will compute the log sizes; and in FIG. 6, the CPU 18 will build sector lists for each log. These are lists of which sectors the log is using, sorted into the correct order oldest to newest. The computing the log size process of FIG. 5 is the primary one for the end of life strategy of the flash device 28. It adjusts sizes of one or more logs down to what can be supported with however many not-yet-dead sectors there are left.

Referring to FIG. 4, upon each meter startup (step 116), the dead sector list is read from EEPROM 26 (step 118) and it is determined if each sector is on the dead sector list (step 120). If a sector is not on the dead sector list, the sector header is read from the flash device 28 (step 122). If, at step 124, the sector header reads back OK, the assignment sequence number and erase count are copied into the sector directory (step 126). At step 128, it is determined if all the sectors have been read and if not the process will go back to step 120 until all sectors are read. If at step 120, it is determined that the sector is on the dead sector list or if at step 124 it is determined that the sector header is bad, the CPU 18 will set the assignment for that sector in the sector directory to "dead" (step 127).

After all the sectors are read (step 128), it is determined if there are any sectors tagged "dead" that are not on the dead sector list (step 130). If there are any sectors tagged "dead", the sector will be added to the dead sector list (step 132). The process will then proceed to step 134 of FIG. 5.

Referring to FIG. 5, in step 136, RAM 24 will load a log directory for each log with information tied to the log's contents, i.e., number of sectors allowed, bytes per record, records per sector, number of records allowed, etc. The CPU 18 computes a number of free sectors left with all logs filling all their allowed sectors and the dead sectors unavailable (step 138). In step 140, the CPU 18 determines if there are enough free sectors. If there are not, the CPU 18 determines whether all logs are down to 0 or 1 sector allowed (step 144). If it is determined that all logs are not down to 0 or 1 sector allowed, the number of allowed sectors is reduced and the number of allowed records for one of the logs are also reduced in step 146; the process then reverts to step 138.

If it is determined that all logs are down to 0 or 1 sector allowed in step 144, it is determined how many logs are left in step 145. If more than one log is left, one log is removed from the directory by setting its number of allowed sectors to zero (step 148). If in step 146, it is determined that the number of logs left is equal to one, it is determined that the flash chip 28 has reached the end of its life (step 149).

If at step 140, it was determined there are enough free sectors, the CPU 18 will build sector lists for each log as shown in FIG. 6. At step 150, the process will start with the first log. The sector directory is searched for a sector assigned to this log (step 152). If an assigned sector is found in step 154, the sector number will be added to the sector list for this log, in step 156. If an assigned sector is not found in step 154, the sector list is sorted using the sector sequence numbers (step 158). In step 160, it is determined if all logs have been processed. If all logs have not been processed, the process returns to step 152 and processes the next log. Otherwise, if all logs have been processed, the CPU 18 will proceed to load the log information (step 162).

Figure 7:
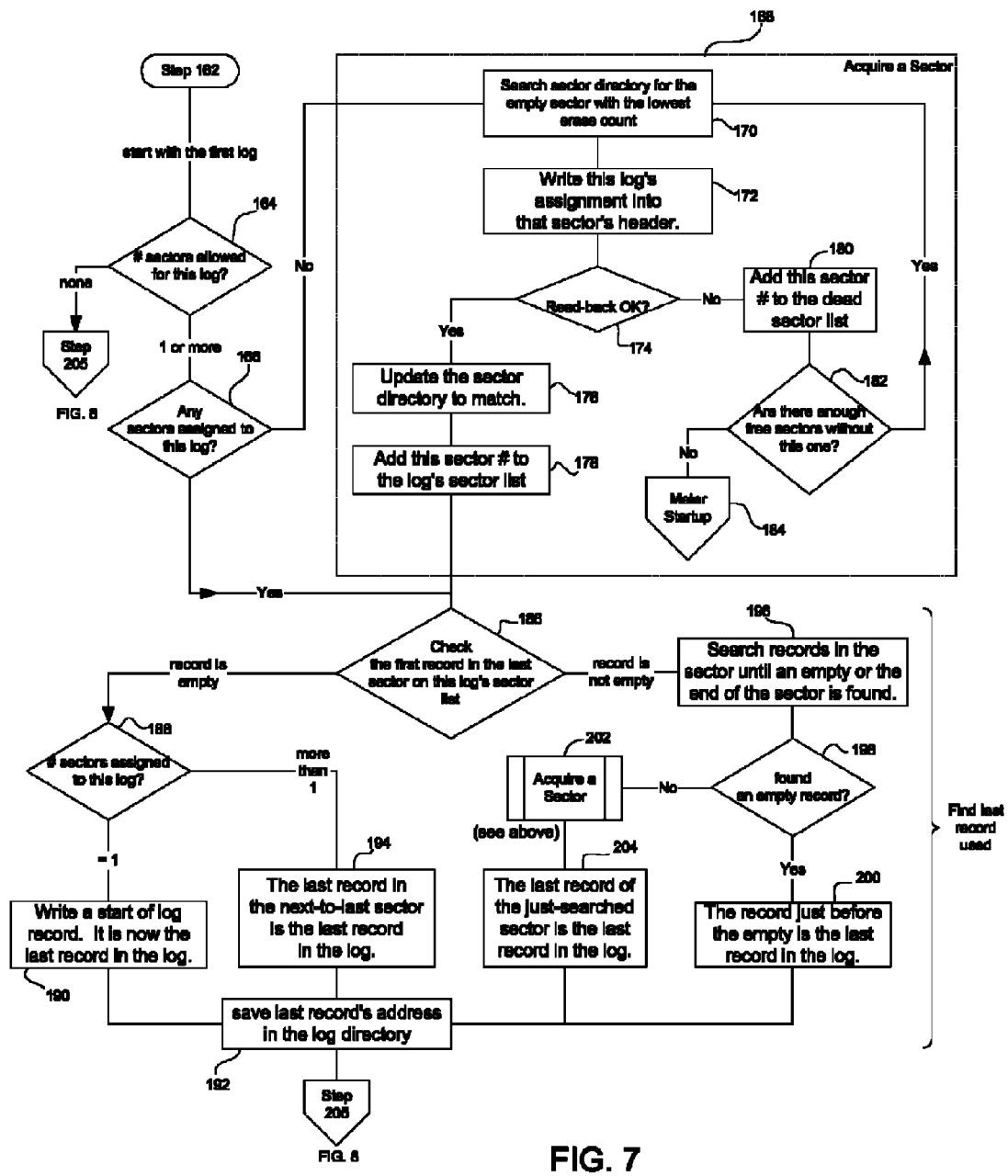
FIGS. 7 and 8 illustrate a flow chart of a method for loading log information in a flash memory device in accordance with the present disclosure.
Figure 8:
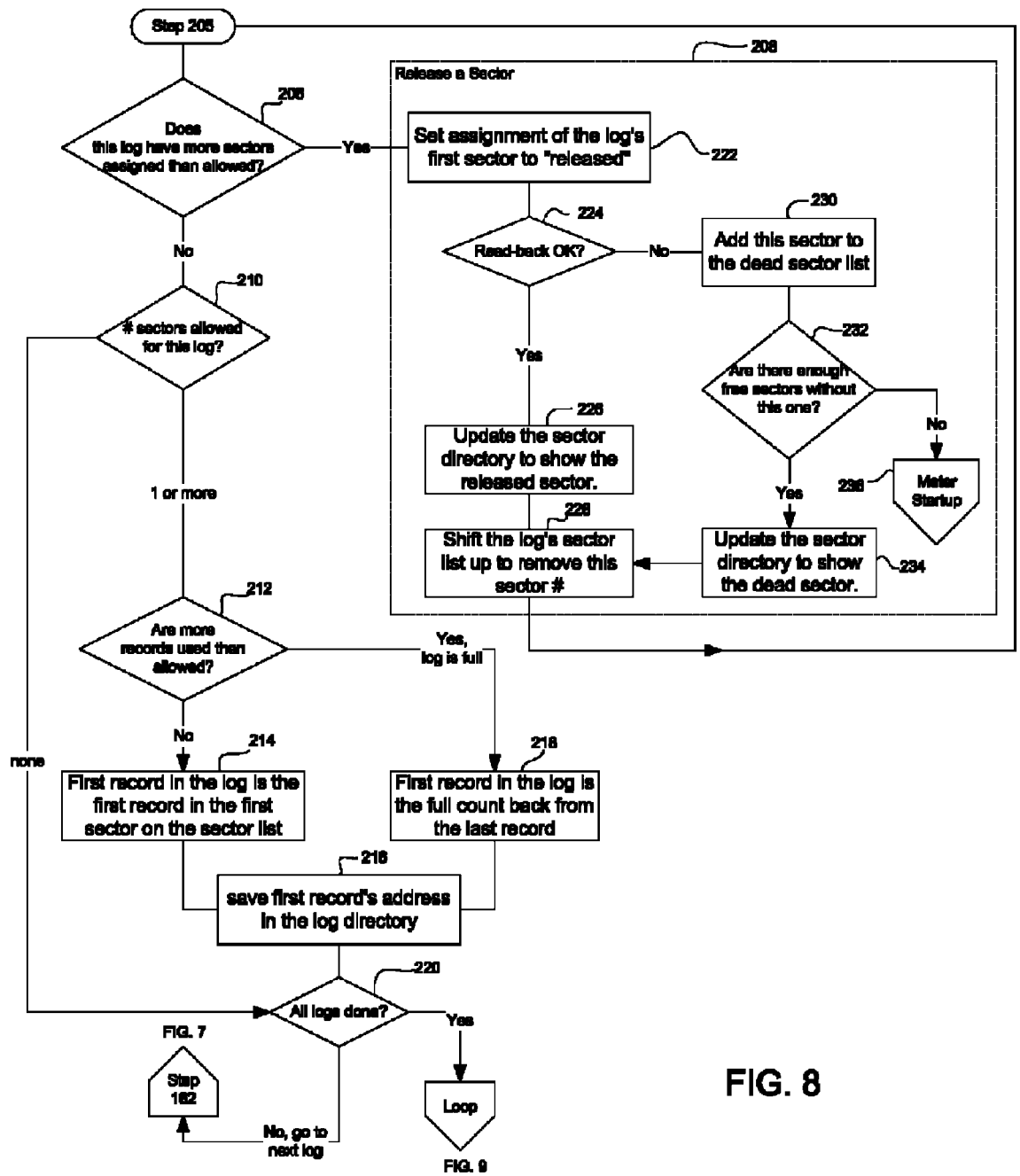

As illustrated in FIGS. 7 and 8, the CPU 18 will determine where the data in each log begins and ends in flash. These figures also show the details of acquiring and releasing sectors. When a process, such as a historical log, needs a block of flash memory allocated to it, it "acquires" a sector as shown in FIG. 7. Generally, to acquire a sector, the CPU 18 will select the sector with the lowest erase count from all the sectors that are "available." The CPU 18 will then write the first assignment byte, the sequence number, and both checksums in that sector's header. The assignment checksum is based on the "in use" image of the header while the released checksum is based on a projection of the header after the released byte has been written. Both are done as part of this operation to ensure that the assigned checksum is valid and the released checksum is invalid.

Referring to FIGS. 7 and 8, the process for loading information into the log will be described. In step 162, the process will begin with the first log. The CPU 18 will determine the number of sectors allowed for this log (step 164). If no sectors are allowed for this log, the process will go to step 205 of FIG. 8 as will be described below. Otherwise, if one or more sectors are allowed for this log, the CPU will determine if any sectors are assigned to this log in step 166. If no sectors are assigned to this log, the CPU 18 will acquire a sector generally indicated by reference numeral 168. Initially, the sector directory is searched for an empty sector with the lowest erase count in step 170. Next, in step 172, the log's assignment is written into the sector's header of the empty sector with the lowest erase count. The sector's header is read back in step 174 to determine if the sector is usable. If the data is read back without error, the sector directory is updated (step 176), the sector's number is added to the log's sector list (step 178) and the process proceeds to finding the last record used as will be described below. If the data is not read back without error in step 174, the sector's number is added to the dead sector list (step 180). In step 182, it is determined if there are enough free sectors without the one just added to the dead sector list. If there are enough free sectors, the CPU 18 will attempt to acquire another sector. If there are not enough free sectors, the process will revert to the meter startup routine shown in FIG. 4.

Either after a sector is acquired (step 168) or it is determined that sectors are assigned to the current log (step 166), the process will find the last record used. In step 186, the first record in the last sector on the current log's sector list is checked to see if the record is empty. If the record is empty, the number of sectors assigned to the current log is determined (step 188). If the number of sectors assigned to this log is equal to one, a start of log record is written; this record is now the last record in the log (step 190). If the number of sectors assigned to the current log is more than one, the last record in the next-to-last sector is the last record in the log (step 194).

If, in step 186, it is determined that the first record in the last sector is not empty, the records in the sector are searched until an empty record is found or the end of the sector is found (196). A linear search was used in the IED 10 of the present disclosure but other search methods may also be used. Next, it is determined if an empty record is found (step 198). If an empty record is found, the record just before the empty record is the last record in the log (step 200). If an empty record is not found (step 198), a sector will be acquired in step 202, as described above. The last record of the acquired sector is the last record in the log (step 204). Regardless of how the last record used is determined, the last record's address is saved in the log directory in step 192.

Continuing on to FIG. 8, the CPU 18 will determine if the current log has more sectors assigned to it than allowed (step 206). If more sectors are assigned than allowed, a sector will be released (step 208), as will be described in more detailed below. If the log does not have more sectors assigned than allowed, the number of sectors allowed for this log is determined (step 210). If the log has no sectors allowed, it will be determined if all logs are done (step 220). If all logs are done, the process will proceed to the main loop illustrated in FIG. 9; otherwise, the process will proceed to the next log and repeat the process starting at step 162 of FIG. 7. If at step 210, it is determined that the number of the allowed sectors for this log is one or more, it is determined if more records are used than allowed (step 212). If less records are used than allowed, the first record in the log is the first record in the first sector on the sector list (step 214); if more records are used than allowed, the log is full and the first record in the log is the full count back from the last record (step 218). In step 216, the first record's address is saved in the log directory.

If it is determined at step 206 that the log has more sectors assigned than allowed, a sector will be released (step 208). Initially, the assignment of the log's first sector is set to "released" (step 222). In step 224, the sector header is read back to determine if the sector is usable. If the sector header reads back without error, the sector directory is updated to show the released sector (step 226). Next, the log's sector list is shifted up to remove this sector number from the list (step 228). If the sector does not read back correctly, the sector is added to the dead sector list (step 230). In step 232, it is determined whether there are enough free sectors without the one just added to the dead sector list. If there are enough free sectors, the sector directory is updated to show the dead sector (step 234); otherwise, the process will proceed to the meter startup routine shown in FIG. 4.

When the data in a sector is no longer needed, the sector is "released", as illustrated in FIG. 8. A released sector may be erased and returned to the pool of available sectors. Generally to release a sector, the CPU 18 will write a fixed value (e.g., the release code) to the second assignment byte. Now the assigned checksum is invalid and the release checksum is valid.

Although shown in FIGS. 7 and 8, which are steps executed only once at IED startup, acquiring and releasing sectors are procedures that occur regularly throughout the life of the IED but rarely during startup processing. In FIG. 7, acquiring a sector occurs only if a log happens to have no sectors assigned or if all are full—both abnormal situations. Similarly, releasing a sector occurs only if a log has more than it is permitted, again an abnormal situation that may occur when logs sizes are reduced late in the life of the flash device(s).

C. Continuous Operation

Figure 9:
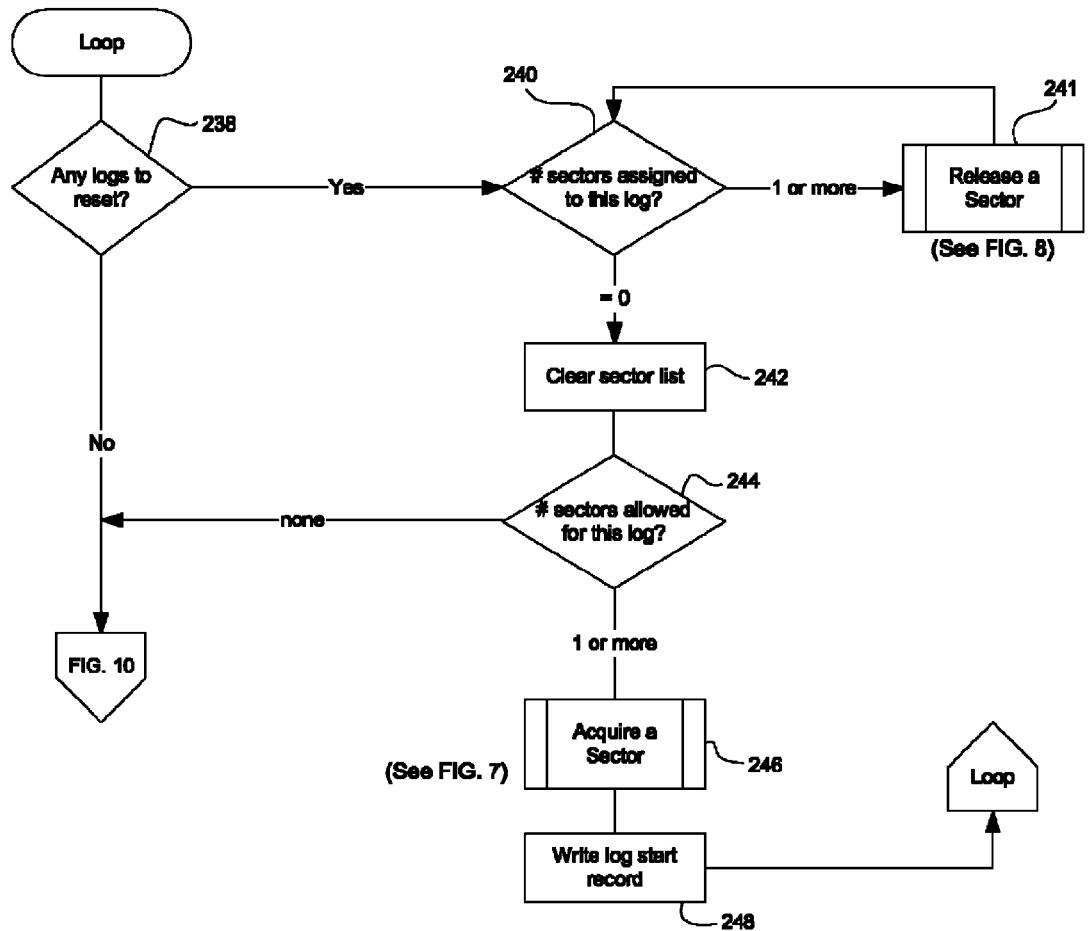
FIG. 9 is a flow chart illustrating a method for resetting a log of a flash memory device in accordance with the present disclosure.
Figure 10:
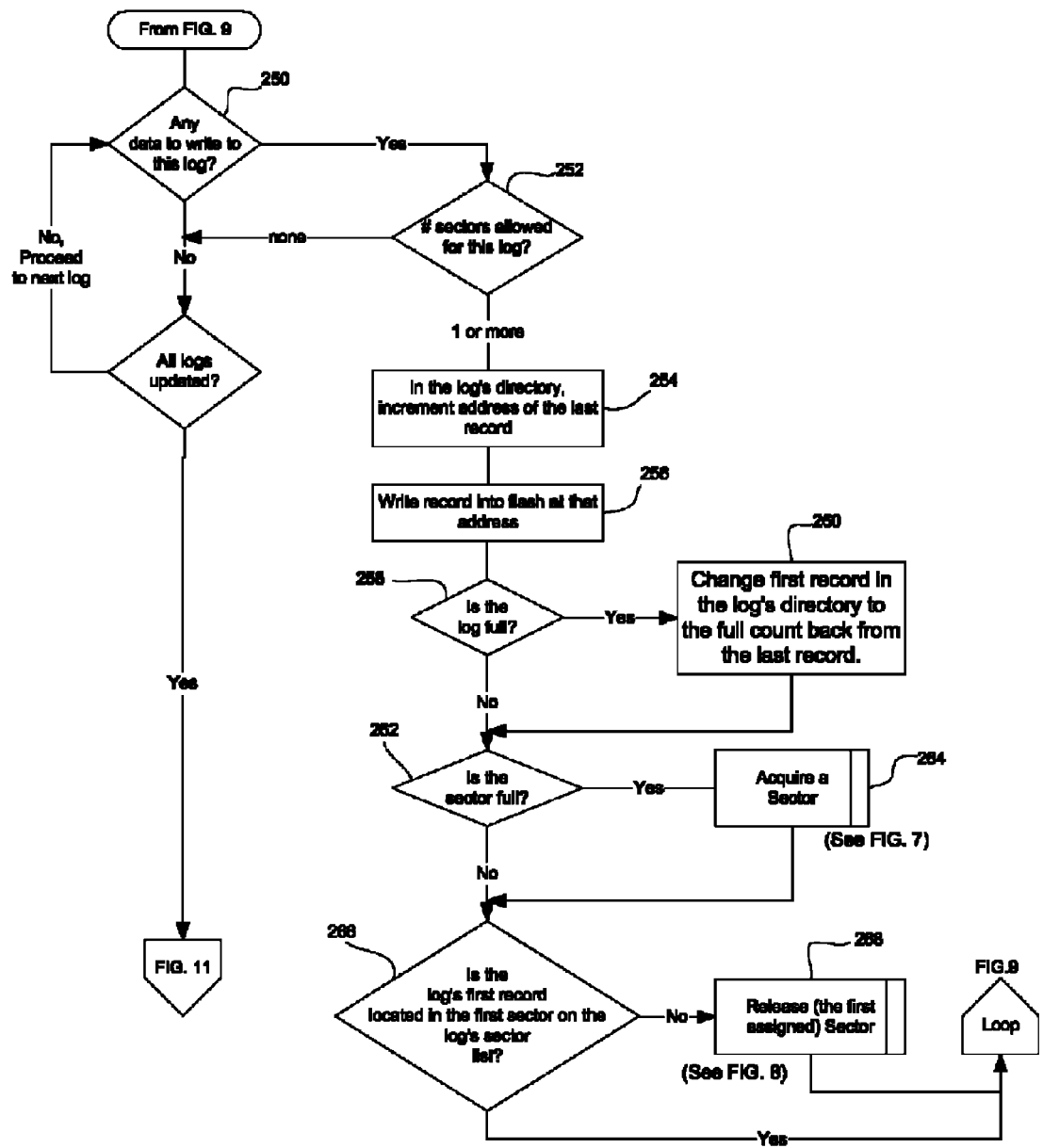
FIG. 10 is a flow chart illustrating a method for appending a record to a log of a flash memory device in accordance with the present disclosure.
Figure 11:
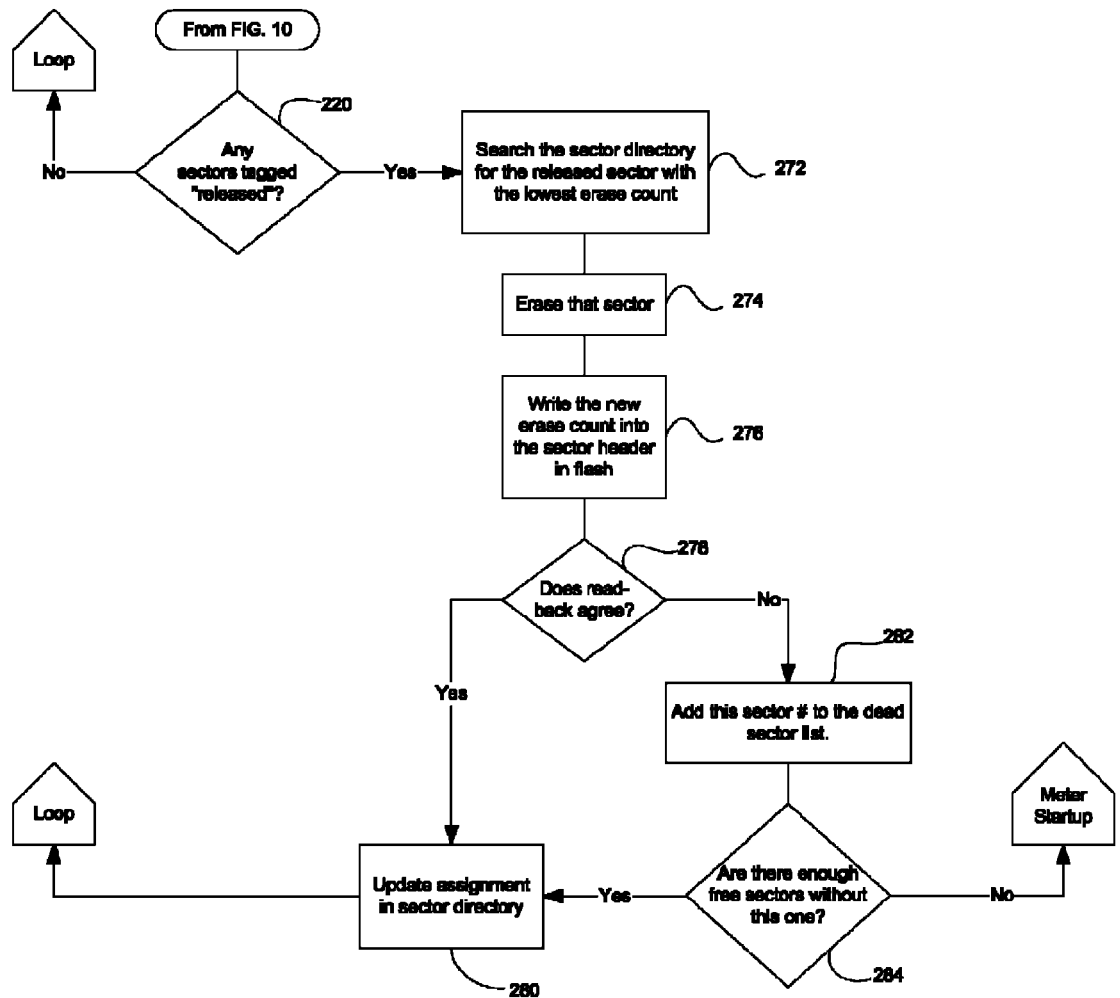
FIG. 11 is a flow chart illustrating a method for emptying a sector of a flash memory device in accordance with the present disclosure.

FIGS. 9-11 illustrate the main loop which will continuously execute while the IED 10 is in operation. Referring to FIG. 9, a process to reset a log is illustrated. This occurs in response to an external input, either from a user or from the communications channels. FIG. 10 illustrates a process for appending a record to a log. This occurs frequently throughout the life of the IED as conditions warrant. FIG. 11 shown a process for emptying a sector, i.e., steps to convert a released sector to an available one. Generally, to erase a sector, the CPU 18 will save the sector's erase count, erase the sector and write the sector header using the saved erase count plus 1.

Referring to FIG. 9, at step 238, the CPU 18 will determine if any logs are to be reset. If a log is to be reset, the number of sectors assigned to this log is determined (step 240). If one or more sectors are assigned to the log, the release a sector routine is executed in step 241 as illustrated in FIG. 8. Sectors continue to be released until none are left, then the sector list is cleared (step 242) and the number of sectors allowed for this log is determined (step 244). If no sectors are allowed for this log, the main processing loop continues as shown in FIG. 10 which will be described below. Otherwise, if one or more sectors are allowed for this log, a sector is acquired in step 246 and a log start record is written in step 248.

Referring to FIG. 10, the CPU 18 determines if any data is to be written for the current log (step 250). If no data is to be written, the next log is checked. Once all logs have been updated, the process will proceed to FIG. 11 and determine if any sectors are to be emptied. Otherwise, if data is to be written, the number of sectors allowed for this log is determined in step 252. If no sectors are allowed, the process will proceed to FIG. 11. If one or more sectors are allowed, the address of the last record in the log's directory is incremented (step 254) and the data is written into the flash device 28 at that address (step 256). Next, the CPU 18 determines if the log is full at step 258. If the log is full, the CPU 18 will change the first record in the log's directory to the full count back from the last record (step 260). Next, the CPU 18 will determine if the sector is full (step 262). If the sector is full, the CPU 18 will acquire a sector (step 264), as described above. Next, the CPU 18 will determine if the log's first record is located in the first sector on the log's sector list (step 266). If affirmative, the process will revert back to the main loop starting at FIG. 9; otherwise, the first assigned sector is released (step 268), and then, the process will revert to the main loop.

Referring to FIG. 11, the CPU 18 will determine if any sectors have been tagged as released (step 270). If no sectors have been tagged as released, the process will revert to the main loop. If sectors have been tagged as released, the CPU 18 will search the sector directory for the released sector with the lowest erase count (step 272) and will erase that sector (step 274). The new erase count will be written into the sector header in the flash device (step 276). The erase count will be read back to determine if the sector is good (step 278). If the data read back agrees, the assignment is updated in the sector directory (280). If the data read back does not agree, this sector will be added to the dead sector list (step 282). The CPU 18 will then determine if there are enough free sectors without the one just added to the dead sector list (284). If there are enough free sectors, the process will proceed to step 280; otherwise, the process will proceed to meter startup.

III. Life Analysis and Insurance

In using the memory management method of the present disclosure, the life of the flash device(s) should never become an issue, as will be illustrated in the examples below. Cases 1 & 2 below are unlikely worst-case scenarios that obviously pose no problem. Case 3 illustrates a situation which can wear out a flash device quickly. In all cases, these assumptions apply:
1. Flash devices are guaranteed for 100,000 erases.
2. Each log is allowed one more sector than its nominal size so that a full log can use only part of its first sector and part of its last.
3. spare sectors are maintained at all times to ensure an empty sector is available whenever there is a need to acquire one.
4. Historical logs may be configured by the user with respect to how many bytes are used per record and now many sectors are allowed per log.

Case 1:

Assume that three (3) historical logs are set for 256 byte records at 1 minute intervals, log sizes are set for 1 sector each, the remainder of the pool is assigned to other logs, and all the other logs are full and inactive. Once all 3 historical logs are full, each will need a new sector every 255 records which is also 255 minutes. The erases will be spread over 10 sectors (the 4 spare sectors plus 2 for each log).

$$yrs \text{ life} = \text{erases/sector} * \text{sectors} * \text{min/erase} * hr/\text{min} * \text{day}/hr * \text{yr/day}$$
$$= 100,000 * 10 * 255/3 * 1/60 * 1/24 * 1/365.25$$
$$= 161 \text{ years}$$

Case 2:

Assume historical log 3 is the only active log and that it is set for 256 byte records at 1 minute intervals as above. Now, there 6 sectors in play and one erase per 255 minutes.

$$yrs \text{ life} = \text{erases/sector} * \text{sectors} * \text{min/erase} * hr/\text{min} * \text{day}/hr * \text{yr/day}$$
$$yrs \text{ life} = 100,000 * 6 * 255 * 1/60 * 1/24 * 1/365.25$$
$$= 290 \text{ years}$$

Case 3:

Assume limits are set up by a user so that the log is updating every 100 milliseconds, that no other logs are active and that the minimum number of sectors is in play. With 16 bytes per record and 1 sector for the log, the log holds 4094 records. There are now 409.4 seconds between erases and 6 sectors available.

$$yrs \text{ life} = \text{erases/sector} * \text{sectors} * \text{sec/erase} * \text{min/sec} * hr/\text{min} *$$
$$\text{day}/hr * \text{yr/day}$$
$$= 100,000 * 6 * 409.4 * 1/60 * 1/60 * 1/24 * 1/365.25$$
$$= 7.78 \text{ years}$$

IV. End of Life Strategy

Eventually, the number of erases will exceed the flash device's specifications and sectors may begin to fail. A sector is declared dead when any write to it fails to verify. When that happens, the CPU 18 acquires an empty sector, copies each record from the failed sector to the newly acquired sector, then appends the new record and verifies it again. While copying the old records, each checksum is confirmed. For records that read with error, a "record lost" bit is set in the record header and the checksum is corrected.

Each time the above procedure is performed, some memory has been permanently lost. At first, the IED 10 can simply run with fewer spares. Once the spares are down to the minimum number needed to operate effectively, the IED 10 will begin reducing log allocations. Various rules may be applied to this endeavor, but the essential steps are reducing the number of sectors in a log and/or reducing the number of logs. Such reductions continue until there are too few viable sectors remaining to keep going. In the IED 10 of the present disclosure, sectors will be taken as needed from the waveform log until it is down to 2 sectors (1 for data, 1 spare), then from history logs 3, 2, and 1. When all logs are down to the minimum 2 sectors, logging will stop with a "logging shut down" record in the system log.

A method for prolonging the life of a flash device in accordance with another embodiment of the present disclosure is illustrated in FIGS. 12-21. The method shown in FIGS. 12-21 is similar to the method shown in FIGS. 3-11 and therefore like elements or method steps use like reference numerals, e.g., step 106 in FIG. 3 is shown as step 1106 in FIG. 12. Basically, the method illustrated in FIGS. 12-21 replaces the concept of a dead sector with a measure of quality for each sector, e.g., an error count. This allows the device to squeeze the maximum life out of each sector by never retiring any sector while endeavoring to always save data in the best sectors available. The best sector is the sector with the lowest erase count from the group with the lowest error count that have an assignment of interest. Sector selection is used for both erasing and acquiring sectors, so the assignment of interest would be either released (eligible for erasing) or available (eligible for acquisition). Basically, to find the best sector, the device 10, first, finds all sectors with the assignment of interest; second, from the assignment group, finds the sectors with the lowest error count; and third, from the lowest error group, finds the sector with the lowest erase count.

Figure 12:
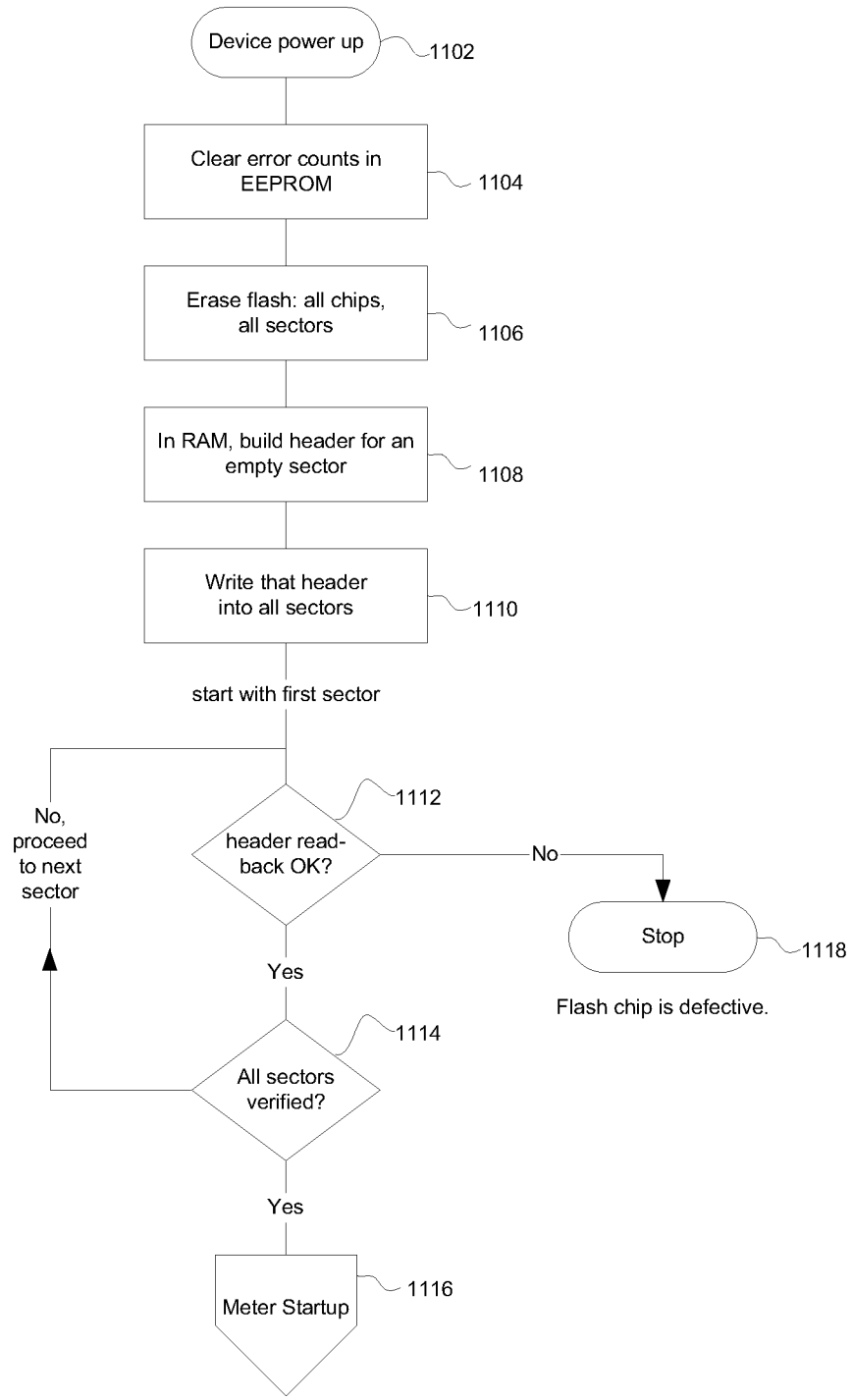

Referring to FIG. 12, the initial flash device setup is illustrated. Preferably, this process is executed once at the factory during manufacture of the IED 10.

I. Device Setup—FIG. 12

A. Erase Whole Chip

When the flash device 28 is first powered up in its target hardware (step 1102), its contents are unknown. Performing an erase of all sectors imposes a known state on every bit in the chip by setting them all to 1's. Therefore, after power-up, an array of error counts is created and cleared in the EEPROM 26 (step 1104) and the flash device 28 is erased (step 1106), i.e., all chips on device 28 and all sectors on any chip of the flash device 28.

B. Write Sector Headers

It is mandatory that the flash device holds all information needed to construct a sector directory of what data is in each sector and which sectors are empty at power up. Initially, in step 1108, RAM 24 will build a header for an empty sector and will write this header into all sectors (step 1110). To address the information requirement, a small number of bytes in each sector are designated to keep track of selected characteristics. In the IED 10 of the present disclosure, the first 20 are used, but the exact number and location are not critical. These bytes form the sector header which must contain at least these 4 elements: erase count, assignment bytes, sequence number, and checksums, which will be described below:

1. Erase Count

This is a count of how many times the sector has been erased. In one embodiment, the erase count is 4 bytes, sufficient to hold a count of many more erases that the device is guaranteed to handle. The initial erase count in each sector is 1, reflecting the erase whole chip step above.

2. Assignment Bytes

These bytes indicate what, if any, data the sector holds. They must be able to indicate all possible stages in the sector's life cycle. In one embodiment, the IED 10 uses 2 bytes for this. Both erased means the sector is available, one erased and one written means there is data in the sector, and both written means the sector has been released. In the one erased and one written case, the value written indicates which log this sector belongs to.

3. Sequence Number

This is a number written into each sector as it is assigned to a log. After each use, the number is increased. Thus for any 2 sectors assigned to the same log, the one with the lower sequence number is known to be the older sector. This is used to determine the order of sectors in a multiple-sector log.

4. Checksums

Since the header holds critical information, it is wise to be able to confirm that the contents are valid. The IED 10 uses CRCs (cyclical redundancy check) for this but other methods could be used. Checksums present an interesting problem in flash devices because they can't be updated when sector bytes are changed. The solution in the IED 10 of the present disclosure is to keep 2 checksums: the first is valid when the sector holds data, the second is valid when the sector is released.

After the sector header is written into each sector, each sector will be verified for operation. Staring with the first sector, the CPU 18 will attempt to read back the sector header (step 1112). If the sector header reads back OK, the CPU 18 will determine if all sectors have been verified (step 1114), and if not, will proceed to the next sector. If all sectors have been verified at step 1114, the IED, e.g., meter, will proceed to startup mode and be operational (step 1116). However, if in step 1112, the sector headers do not read back properly, the flash device 28 will be deemed defective (step 1118).

II. Normal Operations—FIGS. 13-22

A. Life Cycle of a Sector

Each sector in the flash device 28 will follow a cycle of states: erased, available, in use, or released. The cycle will repeat many times (erased→available→in use→released→erased, etc.) as data is saved and removed from the device.

1. Erased

This is a transient state that lasts from sector erase until the sector header is written. In flash device 28, it is defined as a sector header with 1's in all bits of all bytes.

2. Available

An available sector is a sector that holds no data but is available to do so. This is the state set up by writing the sector header described above. There are several ways this could be defined in the sector header. In the IED 10 of the present disclosure, it is the combination of an erase count that is not all 1's and all other bytes of the header that are all 1's.

3. In Use

In this state, the sector is holding data or has been prepared to hold data. An assignment byte is written both to indicate that the sector is no longer available and to indicate what data is in the sector. The first assignment byte is set to the log number and the second remains erased. The sequence number is also written at this time.

4. Released

A released sector holds data that is no longer of interest. It can be erased at any time. Conceptually, this state could be skipped, going right to the erase. However, erases take significantly longer than data operations, so it is useful to be able to delay them until the system is less busy.

B. Construct Directories in RAM of Flash Contents

Once the flash device 28 is initially setup at the factory, the CPU 18 will construct the sector and log directories in RAM 24 of the flash device 28 contents as illustrated in FIGS. 13-17 every time the IED starts up.

Figure 13:
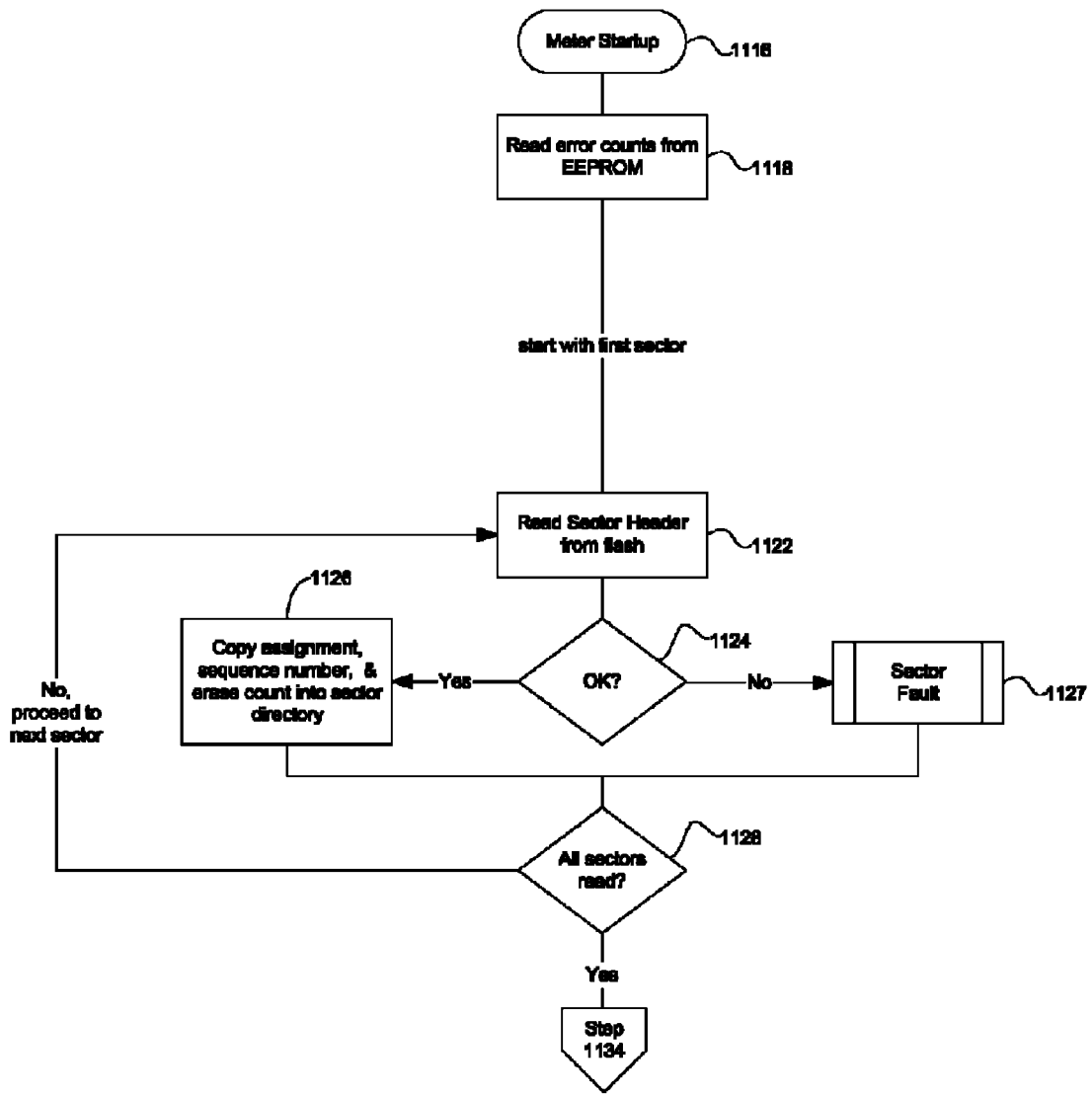
Figure 14:
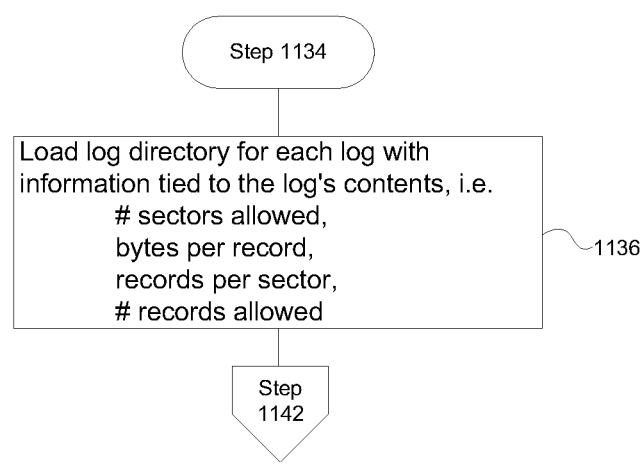
Figure 15:
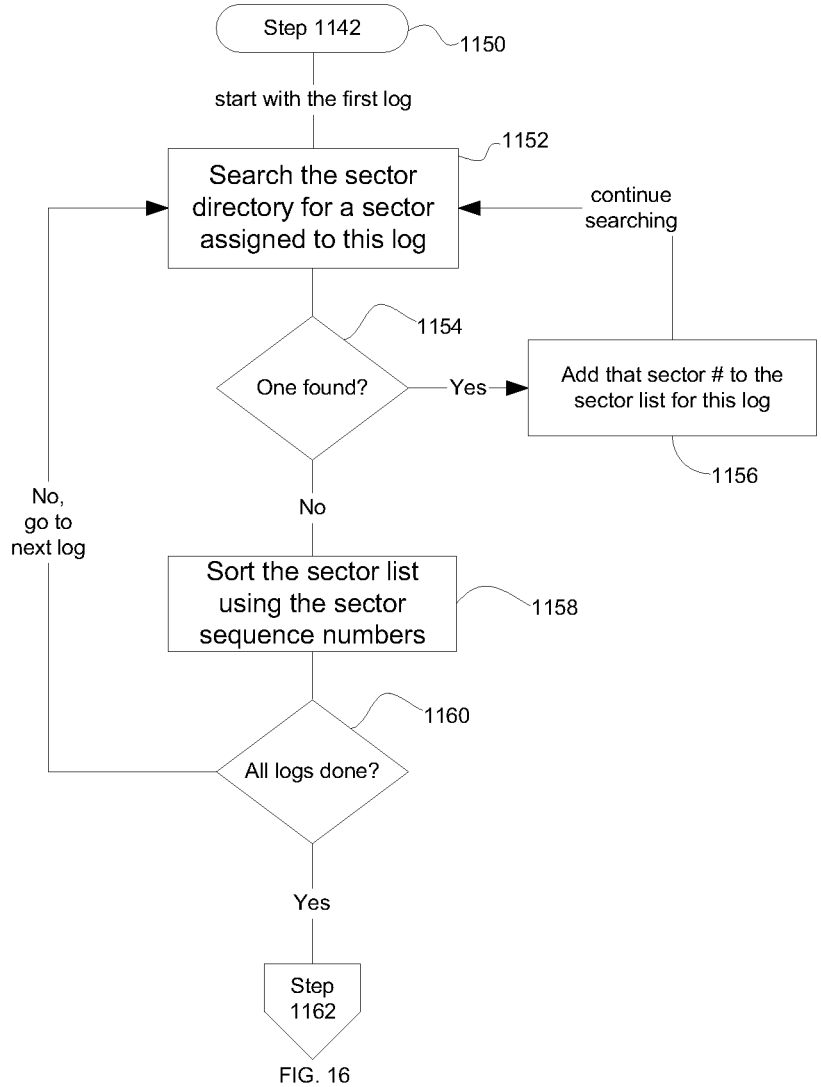

In FIG. 13, the CPU 18 will determine sector assignments and generate the sector directory, in this way, the IED 10 will know what data every sector is holding; in FIG. 14, the CPU 18 will compute the log sizes; and in FIG. 15, the CPU 18 will build sector lists for each log. These are lists of which sectors the log is using, sorted into the correct order oldest to newest.

Referring to FIG. 13, upon each meter startup (step 1116), the error counts array is read from EEPROM 26 (step 1118). A sector header is read from the flash device 28 (step 1122). If, at step 1124, the sector header reads back OK, the assignment sequence number and erase count are copied into the sector directory (step 1126). At step 1128, it is determined if all the sectors have been read and if not the process will go back to step 1120 until all sectors are read. If at step 1124 it is determined that the sector header is bad, the CPU 18 will execute the sector fault procedure (see FIG. 20).

After all the sectors are read (step 1128), the process will then proceed to step 1134 of FIG. 14.

Referring to FIG. 14, in step 1136, RAM 24 will load a log directory for each log with information tied to the log's contents, i.e., number of sectors allowed, bytes per record, records per sector, number of records allowed, etc.

Next, the CPU 18 will build sector lists for each log as shown in FIG. 15. At step 1150, the process will start with the first log. The sector directory is searched for a sector assigned to this log (step 1152). If an assigned sector is found in step 1154, the sector number will be added to the sector list for this log, in step 1156. If an assigned sector is not found in step 1154, the sector list is sorted using the sector sequence numbers (step 1158). In step 1160, it is determined if all logs have been processed. If all logs have not been processed, the process returns to step 1152 and processes the next log. Otherwise, if all logs have been processed, the CPU 18 will proceed to load the log information (step 1162).

Figure 16:
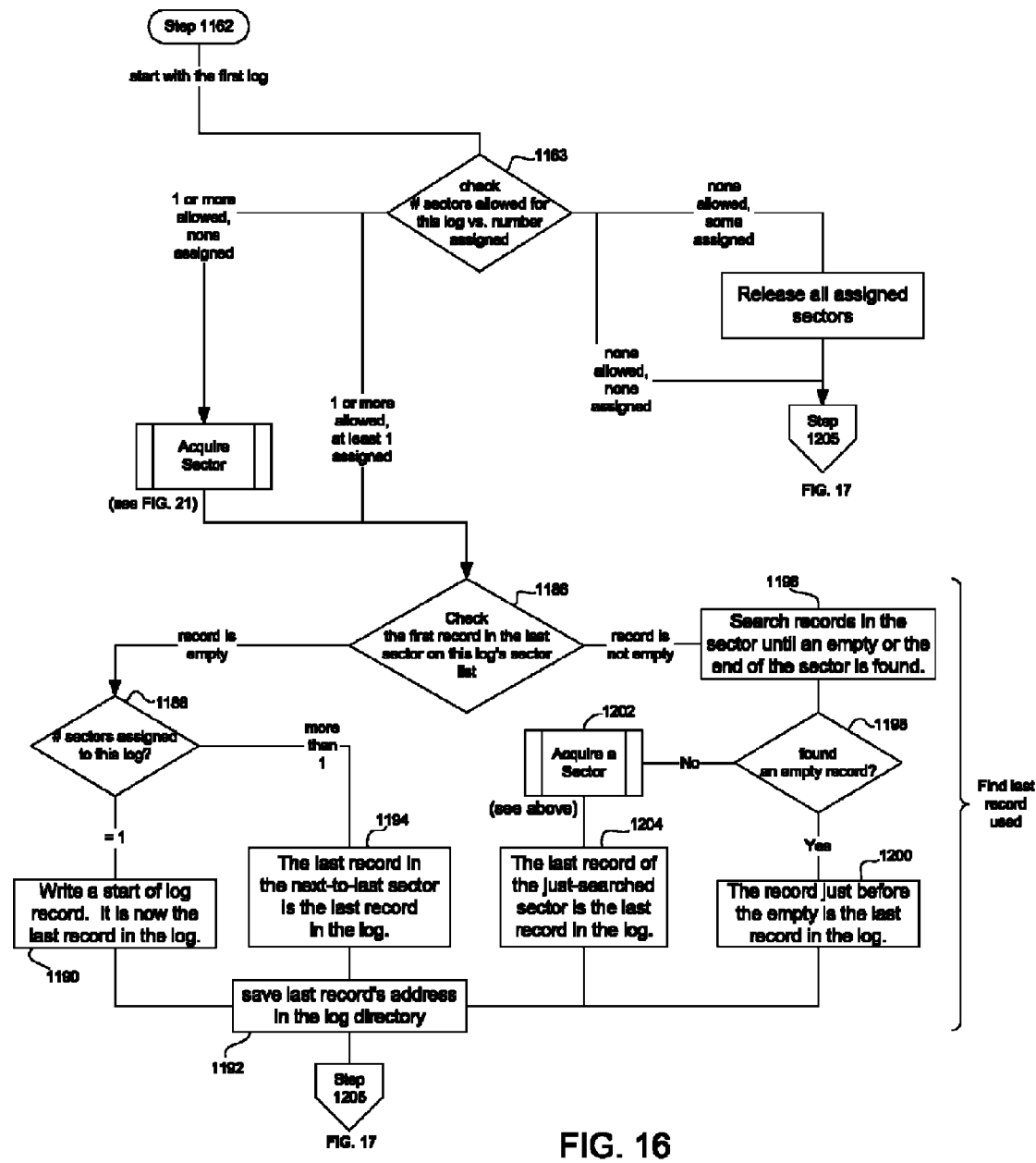
Figure 17:
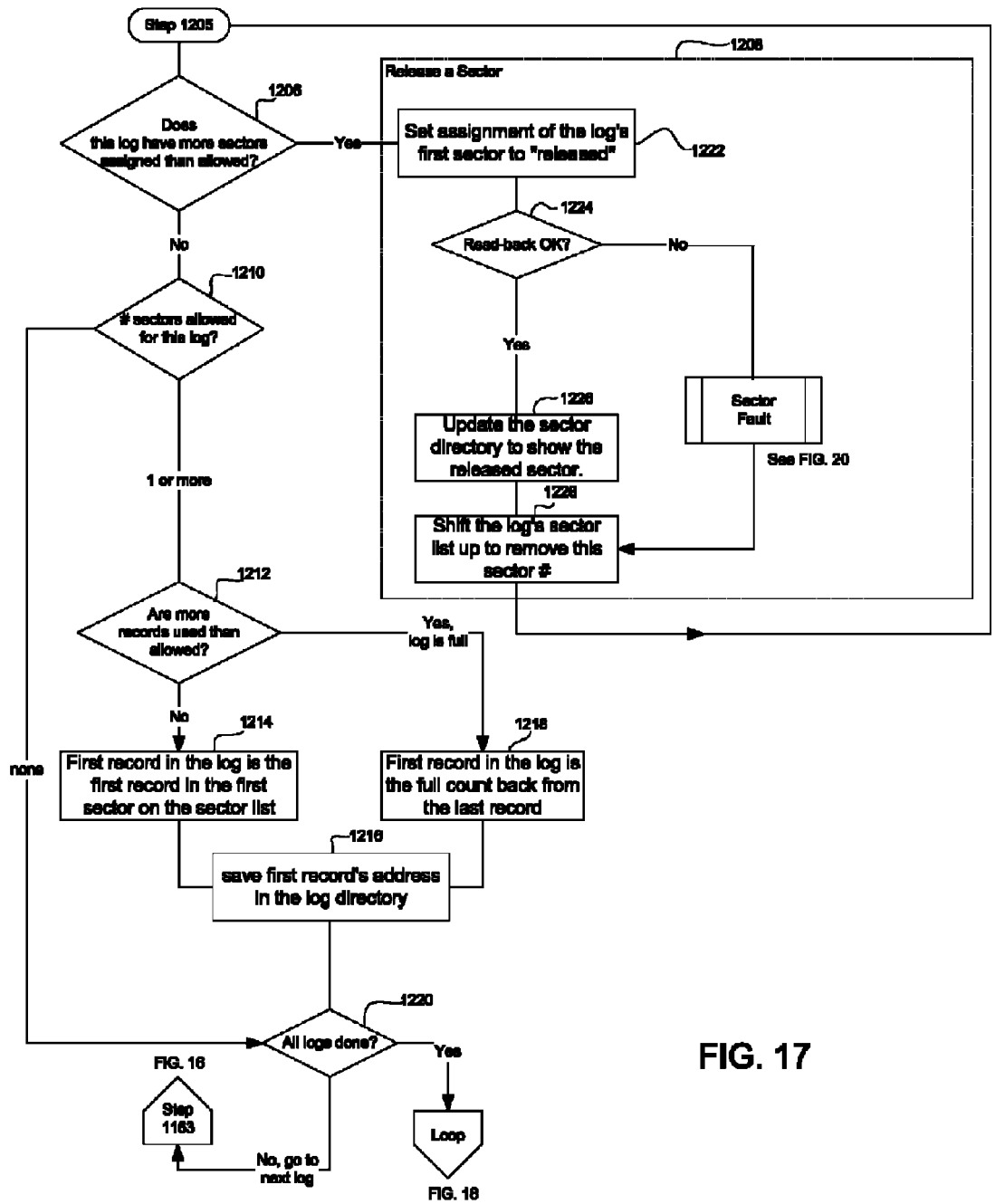
Figure 21:
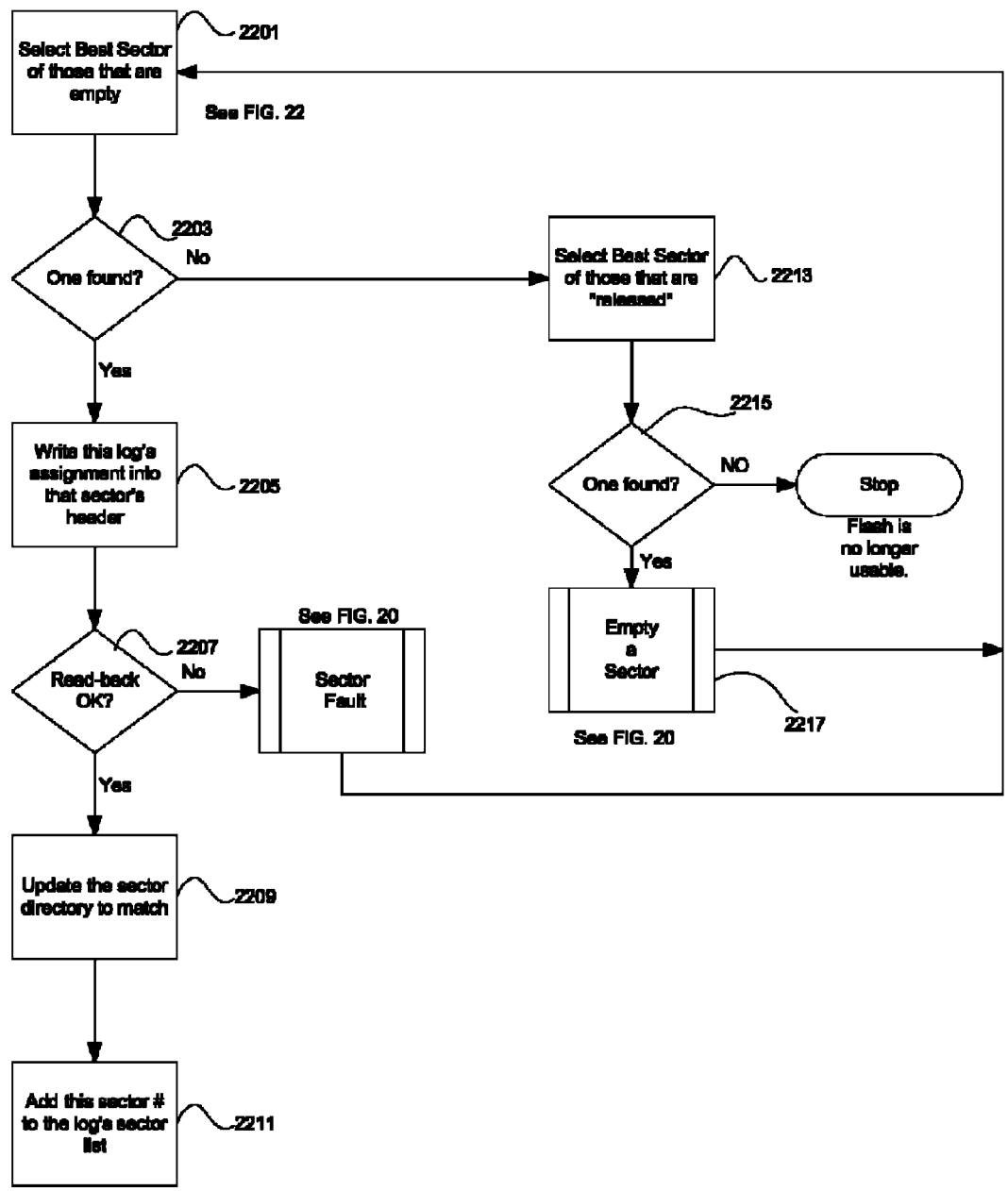

As illustrated in FIGS. 16 and 17, the CPU 18 will determine where the data in each log begins and ends in flash. FIG. 17 shows the details of releasing sectors. When a process, such as a historical log, needs a block of flash memory allocated to it, it "acquires" a sector as shown in FIG. 21. Generally, to acquire a sector, the CPU 18 will determine which sectors are available, determine the lowest error count within the available set, and select the sector with the lowest erase count from within the lowest error count subset. The CPU 18 will then write the first assignment byte, the sequence number, and both checksums in that sector's header. The assignment checksum is based on the "in use" image of the header while the released checksum is based on a projection of the header after the released byte has been written. Both are done as part of this operation to ensure that the assigned checksum is valid and the released checksum is invalid.

Referring to FIGS. 16 and 17, the process for loading information into the log will be described. In step 1162, the process will begin with the first log. The CPU 18 will determine the number of sectors allowed for this log and compare it to the number assigned to this log (step 1163). If no sectors are allowed and none are assigned either, the process will go to step 1205 of FIG. 17. If none are allowed but one or more is assigned, all the assigned sectors are released and then the process will go to step 1205. If one or more sectors are allowed for this log but none are assigned, the CPU 18 will acquire a sector. If the log has both sectors allowed and sectors assigned, the process will proceed from step 1186.

Beginning at step 1186, the process will find the last record used. In step 1186, the first record in the last sector on the current log's sector list is checked to see if the record is empty. If the record is empty, the number of sectors assigned to the current log is determined (step 1188). If the number of sectors assigned to this log is equal to one, a start of log record is written; this record is now the last record in the log (step 1190). If the number of sectors assigned to the current log is more than one, the last record in the next-to-last sector is the last record in the log (step 1194).

If, in step 1186, it is determined that the first record in the last sector is not empty, the records in the sector are searched until an empty record is found or the end of the sector is found (1196). A linear search was used in the IED 10 of the present disclosure but other search methods may be used instead. Next, it is determined if an empty record was found (step 1198). If an empty record was found, the record just before the empty record is the last record in the log (step 1200). If an empty record was not found (step 1198), a sector will be acquired in step 1202, as described above. The last record of the newly acquired sector is the last record in the log (step 1204). Regardless of how the last record used is determined, the last record's address is saved in the log directory in step 1192.

Continuing on to FIG. 17, the CPU 18 will determine if the current log has more sectors assigned to it than allowed (step 1206). If more sectors are assigned than allowed, a sector will be released (step 1208), as will be described in more detailed below, and the test for too many sectors (step 1206) is repeated. If the log does not have more sectors assigned than allowed, the number of sectors allowed for this log is determined (step 1210). If the log has no sectors allowed, it will be determined if all logs are done (step 1220). If all logs are done, the process will proceed to the main loop illustrated in FIG. 18; otherwise, the process will proceed to the next log and repeat the process starting at step 1163 of FIG. 16. If at step 1210, it is determined that the number of the allowed sectors for this log is one or more, it is determined if more records are used than allowed (step 1212). If less records are used than allowed, the first record in the log is the first record in the first sector on the sector list (step 1214); if more records are used than allowed, the log is full and the first record in the log is the full count back from the last record (step 1218). In step 1216, the first record's address is saved in the log directory.

If it is determined at step 1206 that the log has more sectors assigned than allowed, a sector will be released (step 1208). Initially, the assignment of the log's first sector is set to "released" (step 1222). In step 1224, the sector header is read back to determine if the sector is usable. If the sector header reads back without error, the sector directory is updated to show the released sector (step 1226). Next, the log's sector list is shifted up to remove this sector number from the list (step 1228). If the sector header does not read back correctly (step 1224), the sector fault process is executed.

When the data in a sector is no longer needed, the sector is "released", as illustrated in FIG. 17. A released sector may be erased and returned to the pool of available sectors. Generally to release a sector, the CPU 18 will write a fixed value (e.g., the release code) to the second assignment byte. Now the assigned checksum is invalid and the release checksum is valid.

Although discussed above in conjunction with FIGS. 16 and 17, which are steps executed only once at IED startup, acquiring and releasing sectors are procedures that occur regularly throughout the life of the IED but rarely during startup processing. In FIG. 16, acquiring a sector occurs only if a log happens to have no sectors assigned or if all are full—both atypical situations. Similarly, releasing a sector occurs only if a log has more than it is permitted, again an atypical situation that may occur if power is lost while writing new data to the flash device(s).

C. Continuous Operation

Figure 18:
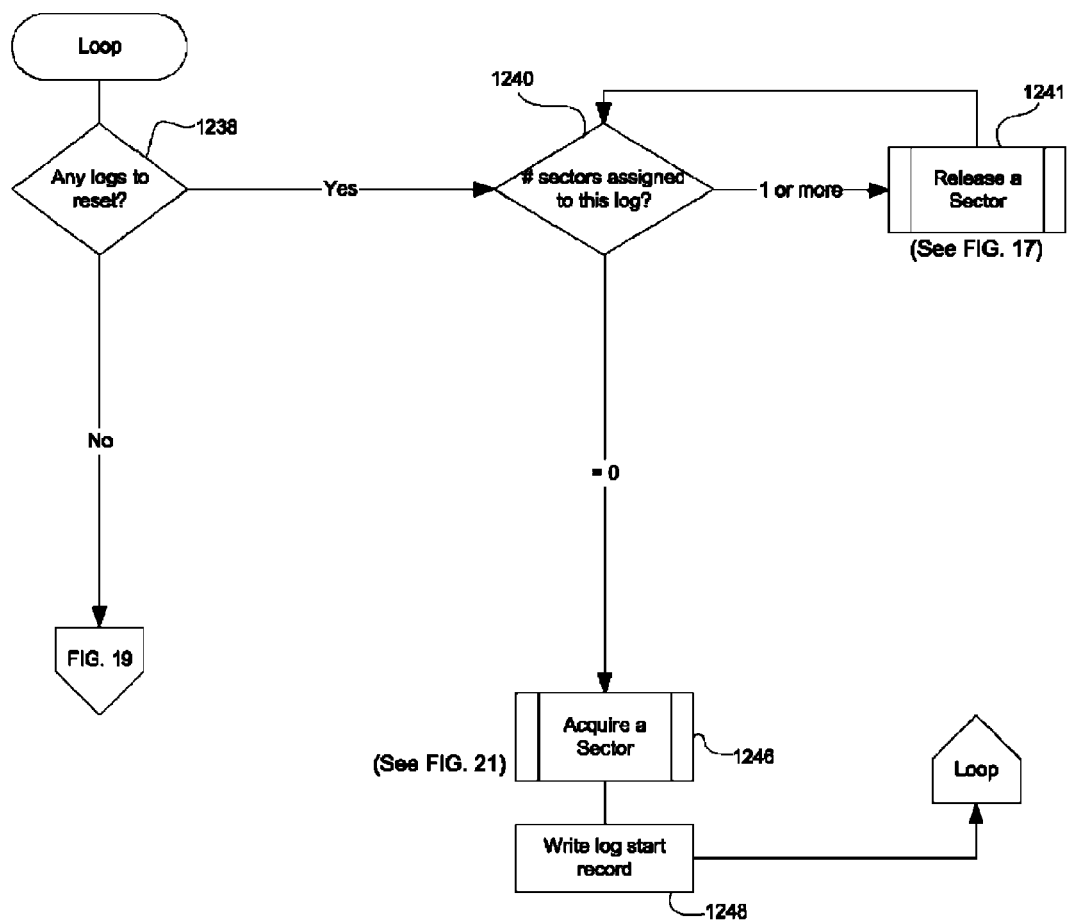
Figure 19:
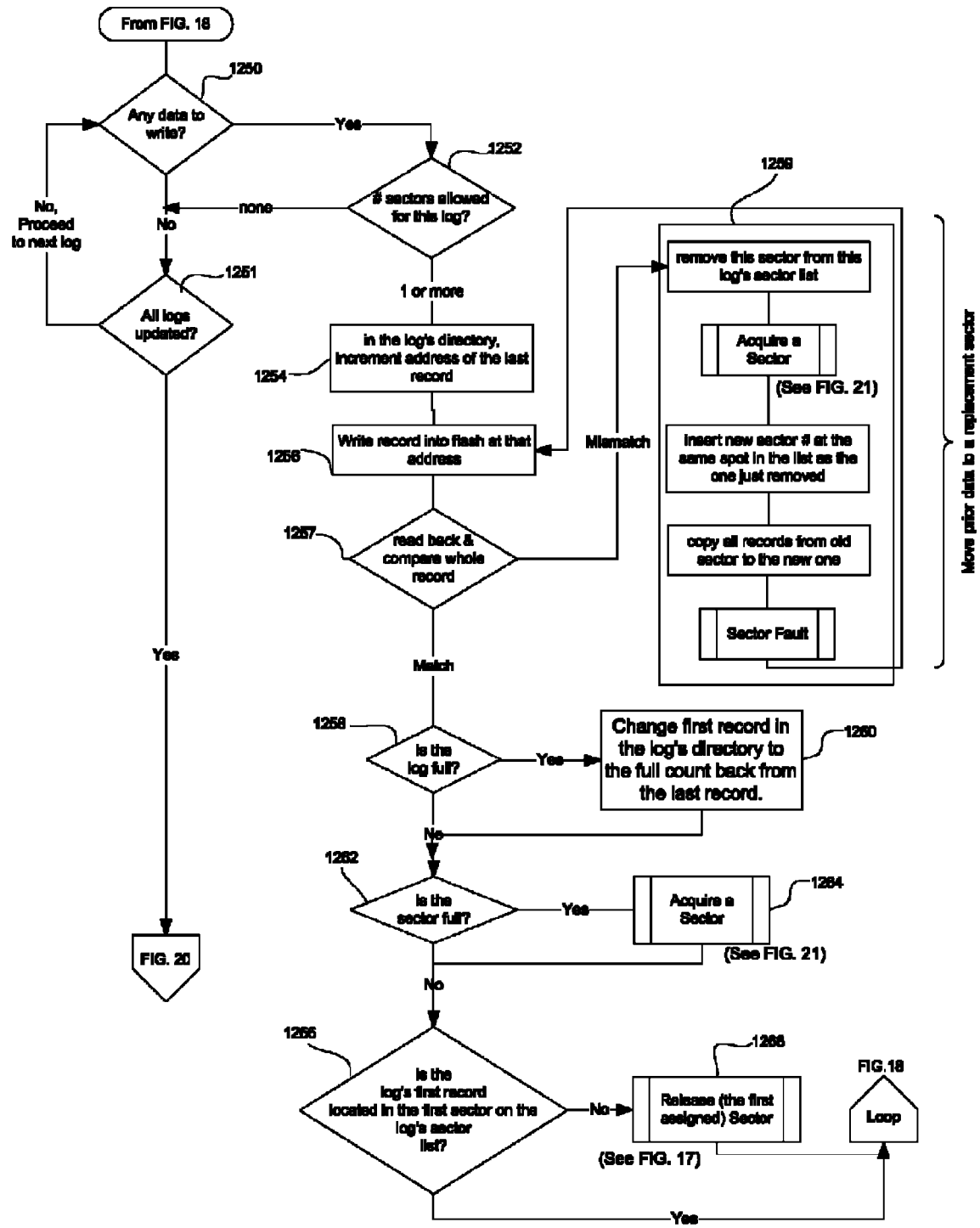
Figure 20:
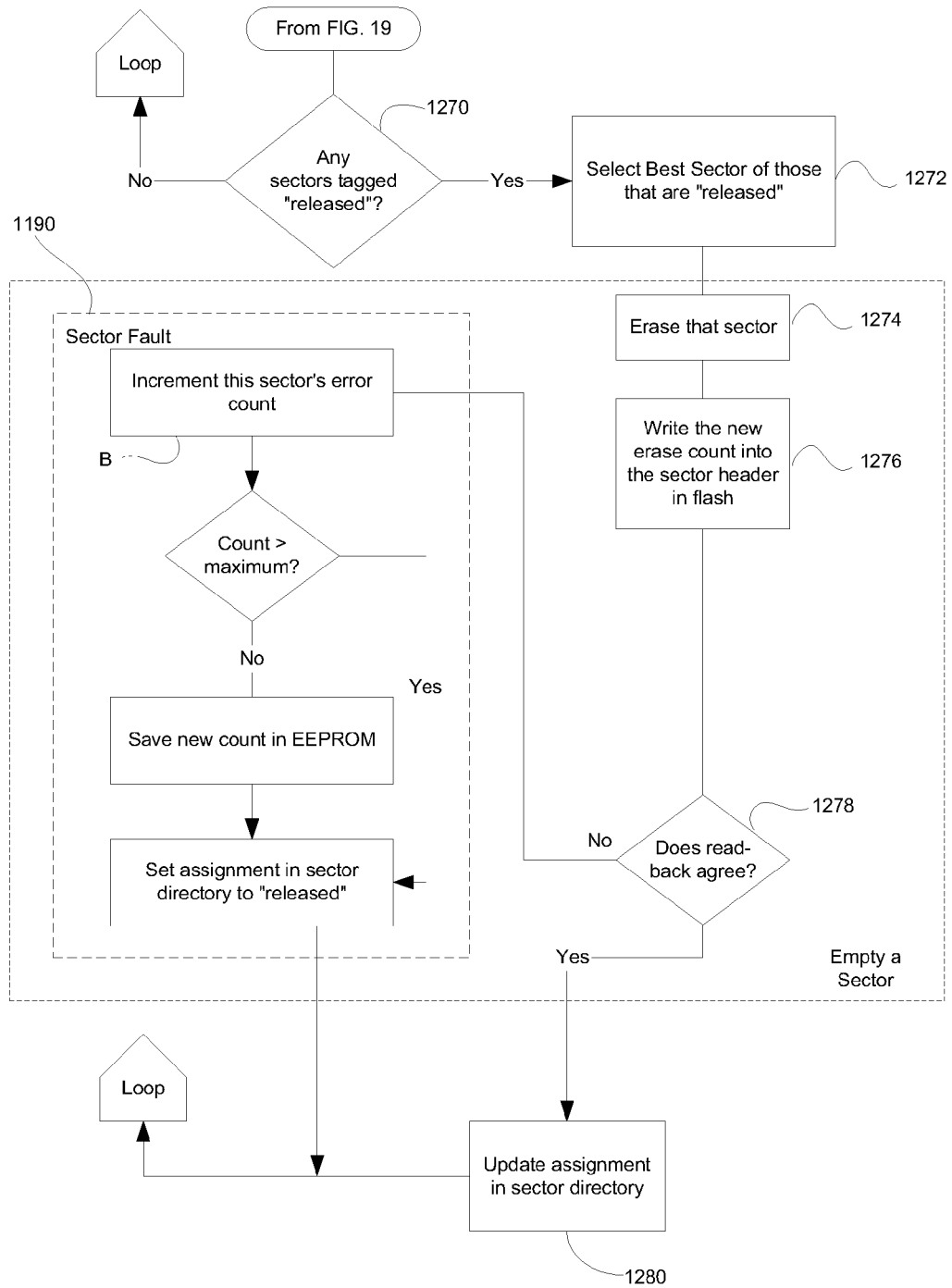

FIGS. 18-20 illustrate the main loop which will continuously execute while the IED 10 is in operation. Referring to FIG. 18, a process to reset a log is illustrated. This occurs in response to an external input, either from a user or from the communications channels. FIG. 19 illustrates a process for appending a record to a log. This occurs frequently throughout the life of the IED as conditions warrant. FIG. 20 shows a process for emptying a sector, i.e., steps to convert a released sector to an available one. Generally, to erase a sector, the CPU 18 will save the sector's erase count, erase the sector and write the sector header using the saved erase count plus 1.

Referring to FIG. 18, at step 1238, the CPU 18 will determine if any logs are to be reset. If a log is to be reset, the number of sectors assigned to this log is determined (step 1240). If one or more sectors are assigned to the log, the release a sector routine is executed in step 1241 as illustrated in FIG. 17. Sectors continue to be released until none are left, then a sector is acquired in step 1246 and a log start record is written in step 1248.

Referring to FIG. 19, the CPU 18 determines if any data is to be written for the current log (step 1250). If no data is to be written, the next log is checked. Once all logs have been updated (step 1251), the process will proceed to FIG. 20 and determine if any sectors are to be emptied. Otherwise, if data is to be written, the number of sectors allowed for this log is determined in step 1252. If no sectors are allowed, the process will proceed to step 1251. If one or more sectors are allowed, the address of the last record in the log's directory is incremented (step 1254) and the data is written into the flash device 28 at that address (step 1256). The whole record is immediately read back (step 1257) and if it matches, the process continues at step 1258. If the match fails, the process moves to step 1259 where the offending sector number is removed from the log's sector list, a new sector is acquired, and the new sector's number is inserted where the old one had been. Next all the records from the old sector are copied into the new sector and then the sector fault process is run on offending sector. In effect, the new sector replaces the one that exhibited an error. The process returns to step 1256 and attempts again to write the new data record.

Once the data has been written and confirmed, the CPU 18 determines if the log is full at step 1258. If the log is full, the CPU 18 will change the first record's address in the log's directory to the full count back from the last record (step 1260). Next, the CPU 18 will determine if the sector is full (step 1262). If the sector is full, the CPU 18 will acquire a sector (step 1264), as described above. Next, the CPU 18 will determine if the log's first record is located in the first sector on the log's sector list (step 1266). If affirmative, the process will revert back to the main loop starting at FIG. 18; otherwise, the first assigned sector no longer holds useful information so it is released (step 1268), and then, the process will revert to the main loop.

Referring to FIG. 20, the CPU 18 will determine if any sectors have been tagged as released (step 1270). If no sectors have been tagged as released, the process will revert to the main loop. If sectors have been tagged as released, the CPU 18 will select which sector to erase according to the select best sector process described below (FIG. 22) and will erase that sector (step 1274). The new erase count will be written into the sector header in the flash device (step 1276). The erase count will be read back to determine if the sector is good (step 1278). If the data read back agrees, the assignment is updated in the sector directory (step 1280). If the data read back does not agree, the sector fault process will be executed.

When data written to the flash reads back incorrectly, a sector fault has occurred. The sector fault process, step 1190 of FIG. 20, increments the error count for the offending sector. Typically the new count is then saved in EEPROM, but if it is above a preset maximum value, the count is left at that maximum and is not saved to EEPROM. This prevents too many writes to the EEPROM device, which is also subject to erase/rewrite limitations. The last step is to set the sector's assignment to released.

FIG. 21 illustrates the acquire sector process as mentioned previously. First, the CPU selects the best sector from among all the empty sectors (step 2201). If the selection is successful (step 2203), the acquiring log's assignment is written into the selected sector's header in step 2205. The sector header is read back and if it matches (step 2207), the sector directory is updated at step 2209 and the sector number is added to the log's sector list at step 2211. If the sector header reads back incorrectly at step 2207, the sector fault process is executed and the process resumes at step 2201 to try again.

If an empty sector is not found at step 2203, it is probably because the CPU has been too busy to erase all the released sectors. Thus the CPU selects the best sector from among all the released sectors (step 2213). If none is found at step 2215, the flash memory is no longer usable. If a released sector is found, it is emptied (step 2217) and processing continues from step 2201.

Figure 22:
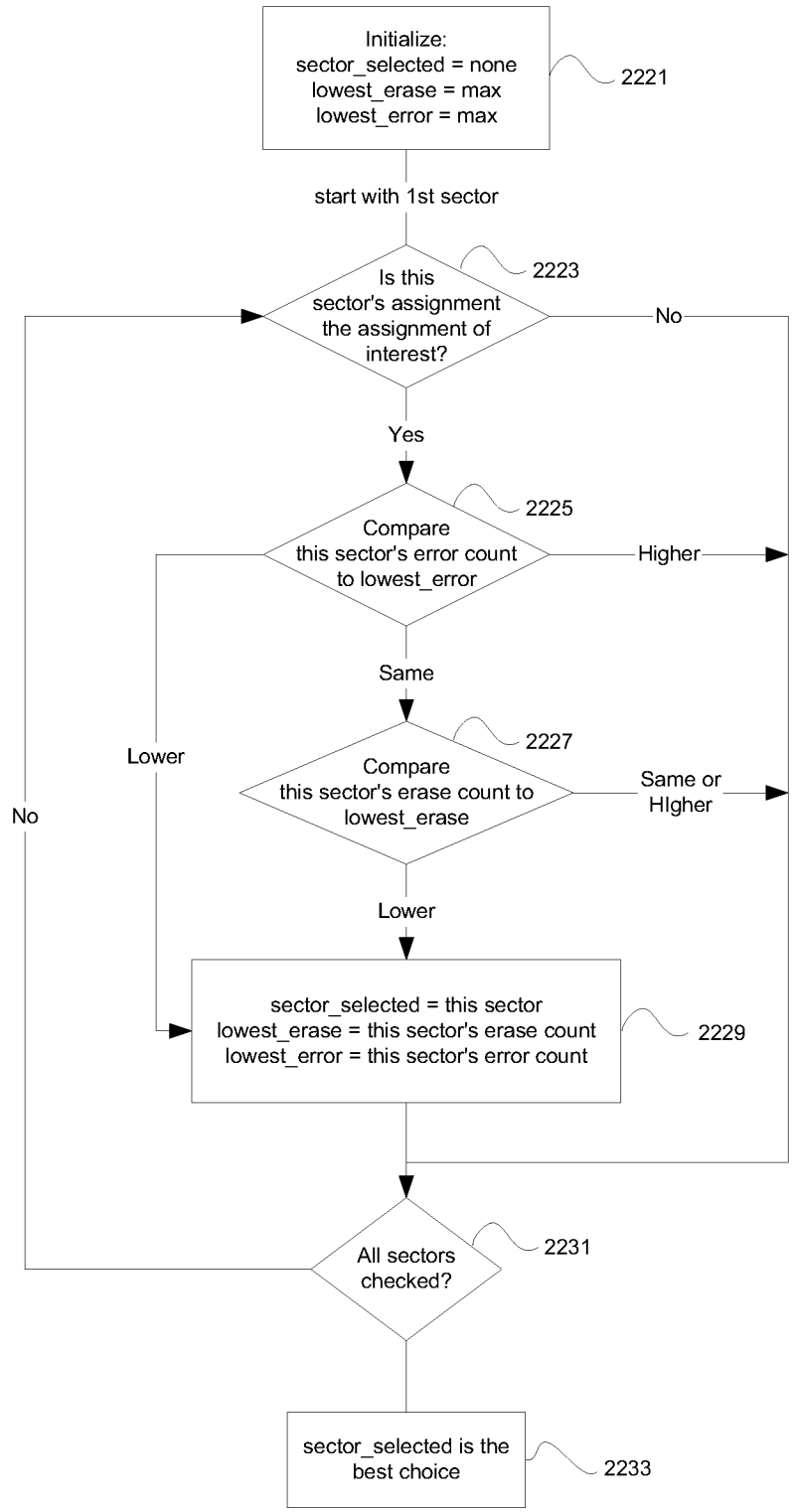
FIG. 22 is a flow chart illustrating a method for choosing which sector to use next.

FIG. 22 illustrates the selection of the best sector to erase or acquire as mentioned previously. In step 2221, 3 temporary values are initialized for the sector selected, lowest error count, and lowest erase count. Then for each sector, its assignment is compared to the assignment of interest at step 2223. If it does not match, the sector is not a candidate and processing continues at step 2231. Otherwise, the sector's error count is compared to the lowest error count at step 2225. If it is lower, this sector is the best choice so far and the process continues at step 2229. If the error count is higher, the sector is not a candidate and processing continues at step 2231. If the error count is the same, the sector's erase count is compared to the lowest erase count at step 2227. If it is the same or higher, this sector is not a candidate and processing continues at step 2231. If the erase count is lower, this sector is the best choice so far and processing continues from step 2229. At step 2229, the best choice so far sector's number, error count, and erase count are saved as the selected sector, lowest error count, and lowest erase count, respectively. At step 2231, it is determined if all sectors have been considered. If not, the process loops back to the assignment comparison at step 2223. If all sectors have been considered, the sector selected is the final choice (step 2233).

While the disclosure has been shown and described with reference to certain preferred embodiments thereof, it will be understood by those skilled in the art that various changes in form and detail may be made therein without departing from the spirit and scope of the disclosure.

What is claimed is:

1. An intelligent electronic device comprising:
 a sensor configured for sensing an electrical parameter distributed to a load;
 an analog-to-digital converter coupled to the sensor, the analog-to-digital converter configured for converting an analog signal of the electrical parameter to digital data, wherein the digital data includes at least one log of the sensed electrical parameter;
 a flash memory device including a plurality of sectors, wherein the plurality of sectors are erased during manufacture of the intelligent electronic device;
 a random access memory (RAM) device; and
 a processing unit coupled to the analog-to-digital converter;
 wherein, after the plurality of sectors of the flash memory device are erased during manufacture of the intelligent electronic device, the RAM device creates a sector header;
 wherein, after creating the sector header and before the sensor is operated, the RAM device writes the sector header into each of the plurality of sectors of the flash memory device;

wherein the processing unit is configured to receive the at least one log and store the at least one log in the flash memory device;

wherein the processing unit is further configured to store the at least one log in at least one of the sectors of the flash memory device to equalize usage of each of the plurality of sectors over time;

wherein the processing unit is further configured to assign a unique sequence number to each of the sector headers associated with the sectors within which the at least one log is stored, the unique sequence numbers being assigned by the processing unit in time sequence such that sorting the unique sequence numbers allows the processing unit to arrange the sectors in correct time sequence; and wherein the processing unit is further configured to construct a log directory for associating each of the plurality of sectors with each of the at least one log;

wherein the processing unit is further configured to determine an error count for each of the plurality of sectors and select a next sector in which to save data based on the error count.

2. The device as in claim 1, wherein the flash memory device is removable.

3. The device as in claim 1, wherein the processing unit is configured to manage wear of the plurality of sectors so that the number of erases for each of the plurality of sectors is equalized over time.

4. The device as in claim 1, wherein the RAM device is further configured to write into each sector header an erase count, assignment, sequence number, and at least one checksum.

5. The device as in claim 4, wherein the assignment comprises erased, available, and in use.

6. The device as in claim 5, wherein the assignment comprises released and error, wherein the assignment of error is equivalent to an assignment of dead.

7. The device as in claim 6, wherein the at least one checksum includes a first checksum that is valid when the assignment is in use and a second checksum when the assignment is released.

8. The device of claim 1, wherein the RAM device is further configured to write into each sector header an assignment identifying the contents of that sector.

9. The device as in claim 8, wherein the assignment comprises erased, available, and in use.

10. The device as in claim 9, wherein the assignment comprises released and error, wherein the assignment of error is equivalent to an assignment of dead and wherein the in use assignment includes a plurality of values distinguishing one use from another.

11. The device as in claim 10, wherein the processing unit is further configured to construct a sector directory for each of the plurality of sectors for indicating the content of each of the sectors.

12. The device as in claim 11, wherein the constructed sector directory is located in a different memory than the at least one log associated with the constructed sector directory.

13. The device as in claim 1, wherein the determined error count is stored in non-volatile memory.

14. The device as in claim 1, wherein the processing unit is further configured to determine an erase count for each of the plurality of sectors and select the next sector in which to save data from the available sectors based on the error count and erase count.

15. The device as in claim 14, wherein the determined erase count is stored in non-volatile memory.

16. The device as in claim 14, wherein the processing unit is further configured to select from the available sectors the next sector in which to save data based on the determined error and erase counts together.

17. The device as in claim 16, wherein the determined error count and determined erase count are stored in non-volatile memory.

18. The device as in claim 16, wherein the processing unit is further configured to store the digital data in at least one sector selected from a group of sectors with the lowest error counts and the sector having the lowest erase count of the group.

19. The device as in claim 1, wherein the RAM device writes an assignment into each sector header, the assignment in each sector header configured to indicate a state of the respective sector as one of erased, available, in use, released, and dead;

wherein an assignment of one of erased, available, in use, and released designates sectors that are operational and an assignment of dead designates sectors that are not operational;

wherein the processing unit is configured to store the at least one log in at least one of the operational sectors of the flash memory device; and wherein the processing unit is further configured to select the next sector based on the operational sector with the lowest error count.

20. A method for managing a flash memory in an intelligent electronic device, the flash memory comprising a plurality of independently-erasable sectors to be used as a set for storing data files, the method comprising the steps of:

erasing the plurality of independently-erasable sectors of the flash memory during manufacture of the intelligent electronic device;

after erasing the plurality of independently-erasable sectors during the manufacture of the intelligent electronic device, creating a sector header;

after creating the sector header, writing the sector header in each of the plurality of independently-erasable sectors of the flash memory device;

after writing the sector header in each of the plurality of independently-erasable sectors, sensing a parameter of electrical power distributed to a load;

converting the sensed parameter from an analog signal to digital data, the digital data including at least one data file to be stored in the flash memory;

determining an erase count of at least one of the plurality of independently-erasable sectors;

determining the at least one independently-erasable sector having the lowest erase count;

assigning a unique sequence number to each of the sector headers associated with at least one of the plurality of independently-erasable sectors within which the at least one data file is stored, the unique sequence numbers being assigned in time sequence such that sorting the unique sequence numbers allows the independently-erasable sectors to be arranged in correct time sequence;

constructing a log directory for associating each of the plurality of independently erasable sectors with each of the at least one data file;

determining an error count for each of the plurality of independently-erasable sectors; and selecting a next independently-erasable sector in which to save data, the next independently-erasable sector being selected based on a group of independently-erasable sectors with the lowest error count and the independently-erasable sector of the group with the lowest erase count.

21. The method as in claim 20, further comprising configuring each sector header of the independently-erasable sectors to store an erase count of a corresponding independently erasable sector.

22. The method as in claim 20, further comprising configuring each sector header to store an assignment of a corresponding independently-erasable sector.

23. The method as in claim 22, wherein the assignment comprises erased, available, in use, released, and error, wherein the assignment of error is equivalent to an assignment of dead, and wherein the assignment of in use includes a plurality of values distinguishing one use from another.

24. The method as in claim 20, further comprising determining the sector assignment and the sequence number for at least one of the plurality of independently-erasable sectors and generating a sector directory.

25. The method as in claim 24, further comprising generating a file directory including determining the independently-erasable sectors belonging to the at least one data file, sorting the independently-erasable sectors into oldest to newest order using the sequence numbers, and determining file sizes, wherein the file size is determined by searching for the end of the at least one data file.

26. The method of claim 25, wherein the sector and file directories are located in a memory that is different from a memory in which data referenced by the sector and file directories is stored.

27. The method of claim 24, wherein the sector directory comprises means for the intelligent electronic device to determine the contents of every independently-erasable sector.

28. The method as in claim 20, further comprising the step of writing an assignment into each sector header, the assignment in each sector header configured to indicate a state of the respective independently-erasable sector as one of erased, available, in use, released, and dead, an assignment of one of erased, available, in use, and release designating independently-erasable sectors that are operational and an assignment of dead designating independently-erasable sectors that are not operational; and wherein the step of selecting the next independently-erasable sector in which to store the data includes selecting an operational independently-erasable sector.

* * * * *